(12) United States Patent
Machida et al.

(10) Patent No.: US 7,868,353 B2
(45) Date of Patent: Jan. 11, 2011

(54) SOLID-STATE SWITCH CAPABLE OF BIDIRECTIONAL OPERATION

(75) Inventors: Osamu Machida, Saitama (JP); Mamoru Tsuruya, Saitama (JP)

(73) Assignee: Sanken Electric Co., Ltd. (JP)

( * ) Notice: Subject to any disclaimer, the term of this patent is extended or adjusted under 35 U.S.C. 154(b) by 0 days.

(21) Appl. No.: 12/389,027

(22) Filed: Feb. 19, 2009

(65) Prior Publication Data

US 2009/0206363 A1 Aug. 20, 2009

(30) Foreign Application Priority Data

Feb. 20, 2008 (JP) ............................... 2008-038660

(51) Int. Cl.
*H01L 29/66* (2006.01)
(52) U.S. Cl. ........................ 257/133; 257/192; 257/173; 257/355; 257/E29.242
(58) Field of Classification Search ................. 257/174, 257/355, 360, 546, 133, E29.242
See application file for complete search history.

(56) References Cited

U.S. PATENT DOCUMENTS 6,087,740 A * 7/2000 Williams .................... 307/125

2004/0124435 A1 * 7/2004 D'Evelyn et al. ........... 257/103
2008/0061400 A1 * 3/2008 Williams et al. ............ 257/546

FOREIGN PATENT DOCUMENTS

WO WO2005/079370 A2 9/2005

* cited by examiner

*Primary Examiner*—Davienne Monbleau
*Assistant Examiner*—Matthew Reames
(74) *Attorney, Agent, or Firm*—Woodcock Washburn LLP

(57) ABSTRACT

A monolithic switching device including a main semiconductor region configured to provide a current-carrying channel as in the form of two-dimensional electron gas. Disposed symmetrically on a surface of the main semiconductor region are two main electrodes to be coupled to an electric circuit for switching control, two gate electrodes for individually controlling current flow between the main electrodes through the current-carrying channel, and two diode-forming electrodes electrically connected respectively to the two main electrodes. The device operates in either Switch On Mode, Switch Off Mode, Negative Current Mode, or Positive Current Mode depending upon voltages applied to the two gate electrodes.

10 Claims, 13 Drawing Sheets (A)    (B)    (C)    (D)

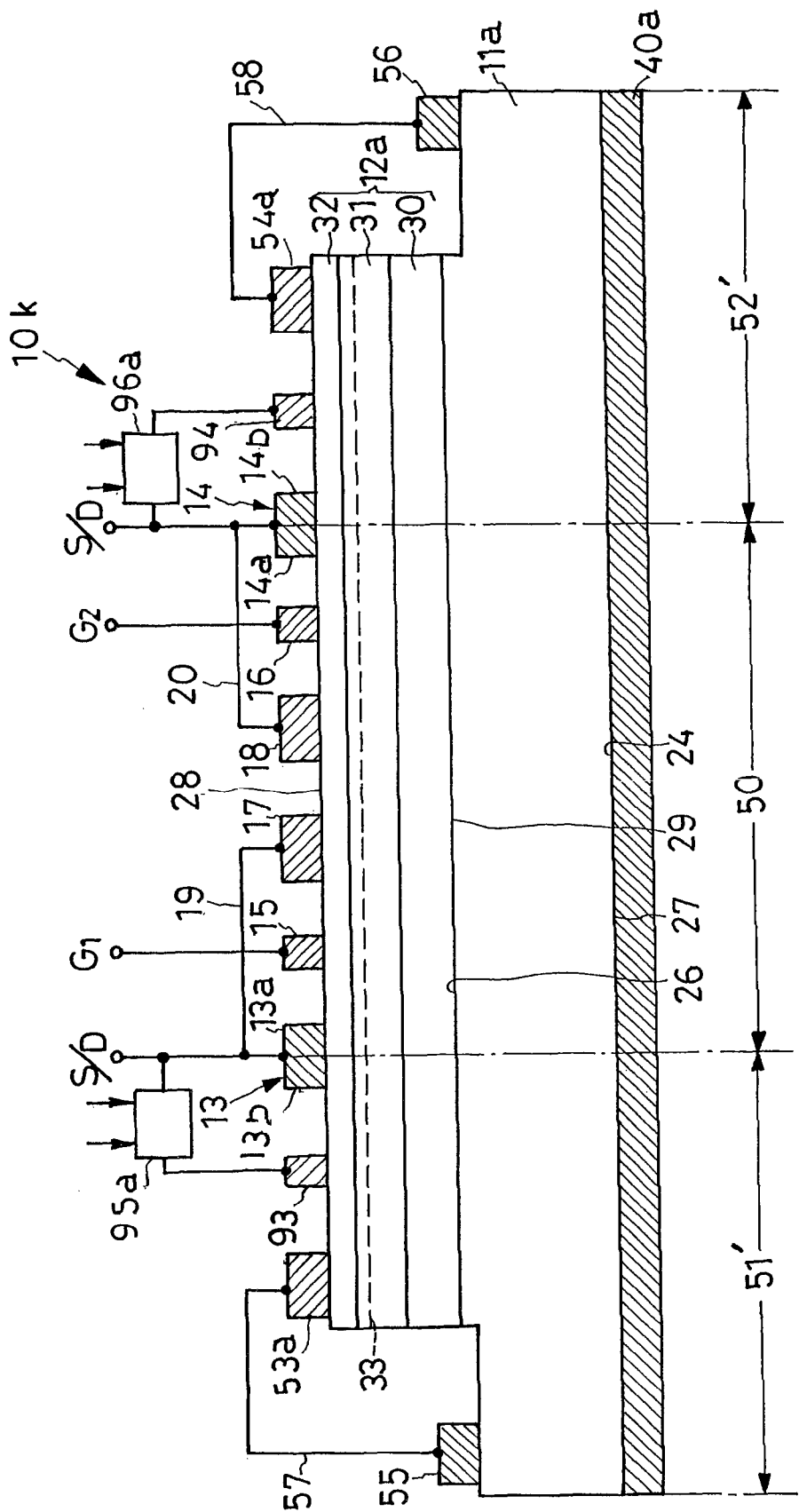

US 7,868,353 B2

SOLID-STATE SWITCH CAPABLE OF BIDIRECTIONAL OPERATION

CROSS REFERENCE TO RELATED APPLICATIONS

This application claims priority to Japanese Patent Application No. 2008-038660, filed Feb. 20, 2008.

BACKGROUND OF THE INVENTION

This invention relates generally to electronic switches, and particularly to those well suited for on-off control of a variety of electric circuits notably including matrix converters and AC power supplies. More particularly, the invention deals with a solid-state, monolithic switching device that lends itself to use as a bidirectional, or alternating current (AC), switch.

Perhaps the most familiar example of AC switches is a bidirectional triode thyristor, better known as a TRIAC (TRIode for Alternating Current). The TRIAC has the weakness that, once triggered, it remains conductive until the current flowing therethrough drops below a predefined threshold value. It cannot possibly be turned off at a controllable point in an AC cycle.

Some bidirectional switching devices have been known which meet that requirement. One of them (shown in FIG. 1 of the drawings attached hereto) is a multifunction bidirectional switch capable of operation in four different modes to be set forth later in this specification. It comprises two insulated-gate bipolar transistors (IGBTs) connected in inverse series with each other, and two diodes connected in inverse parallel with the respective IGBTs. The two IGBTs are replaceable with insulated-gate field-effect transistors (IGFETs), junction gate field-effect transistors (JFETs), or bipolar transistors. A further known bidirectional switch is an inverse parallel connection of two IGBTs.

These prior art bidirectional switching circuits, all incorporating discrete normally-off electronic switches, are alike in being unnecessarily bulky and complex in construction and high in on-state voltage and resistance. Moreover, being made from semiconducting silicon materials with relatively low bandgaps, such known devices are not so high in antivoltage strength as can be desired.

Patent Cooperation Treaty International Publication Number WO 2005/079370 A2 by International Rectifier Corporation teaches a III-nitride bidirectional switch in the form a monolithically integrated circuit free from the noted drawbacks of the more conventional devices above. It has a first semiconductor body of GaN and, thereover, a second semiconductor body of AlGaN. A pair of ohmic power electrodes (interchangeable source and drain) overlie the second semiconductor body in ohmic contact therewith. A gate electrode is disposed between the ohmic electrodes and makes a schottky contact with the second semiconductor body. Being of symmetrical make, this known device is capable of on/off operation when either of the two ohmic electrodes is higher in potential than the other, that is, when either a positive or a negative voltage is applied therebetween.

The prior art III-nitride bidirectional switch above offers the benefit of less manufacturing costs through monolithic integration of a minimal number of constituent parts. Another strength is a higher antivoltage strength earned by use of semiconducting nitrides or other compounds for the semiconductor bodies. Offsetting these benefits, however, is the fact that the device is materially less versatile in use than the multifunction bidirectional switch first cited above, the former being incapable of operation in two of the four different modes possible with the latter. A more in-depth discussion will be given subsequently on this subject as it concerns the very gist of the instant invention.

There is another circumstance that has been taken heed of in developing the instant invention. That is a strong customer demand for stabilization of the potential of the substrate supporting the semiconductor bodies in the second cited bidirectional switch and other devices of comparable design. To that end, in the known high electron mobility transistor (HEMT) for example, the source is electrically connected to the substrate. This solution is impossible, or at least undesirable, in electronic switches of symmetrical design now under consideration, in which each of the two ohmic electrodes may serve as either source or drain.

SUMMARY OF THE INVENTION

The present invention has it as an object to impart greater versatility and utility to a monolithic, solid-state switching device of symmetrical design than heretofore.

Another object of the invention is to add greater stability to the potential of the substrate of switching devices of the kind defined.

Briefly, the invention may be summarized as a solid-state switching device for on-off control of electric circuits such as a matrix converter and alternating-current power supply, among other applications. Included is a main semiconductor region of any of some different configurations disclosed herein which are alike in providing a two-dimensional electron gas or other current-carrying channel in that region. Formed on a major surface of the main semiconductor region are: (a) a first and a second main electrode disposed in spaced-apart positions in ohmic contact therewith; (b) first and second gate means disposed in spaced-apart positions between the first and the second main electrode for individually controlling current flow between the first and the second main electrode through the current-carrying channel in the main semiconductor region; (c) a first and a second diode-forming electrode disposed between the first and the second gate means. The first and the second diode-forming electrode are electrically connected respectively to the first and the second main electrode.

Thus, although similar to the bidirectional switch according to WO 2005/079370 A2 in being in the form of a monolithic integrated circuit, the switching device according to the present invention is clearly distinguished therefrom in additionally comprising two diode-forming electrodes. These additional electrodes provide, in combination with the two main electrodes, diodes that perform the same functions as the discrete diodes of the prior art non-monolithic bidirectional switching device cited above. As a consequence, as will be detailed shortly, the monolithic switching device according to the present invention is as versatile as that non-monolithic prior art device, being capable of operation in just as many different modes as the latter. It will be appreciated that the present invention employs but two additional electrodes for incorporating the two required diodes into the monolithic, multifunction switching device.

Another advantage of the switching device according to this invention is that all the electrodes, including the diode-forming electrodes, are disposed on one and the same surface of the main semiconductor region. Therefore, with its noted multifunctionality taken into account, the device according to the invention is extremely compact in size and easy and inexpensive of manufacture.

The present invention also features, in the switching device of the above summarized construction built on a substrate of electroconductive material, means for stabilizing the potential of that substrate. Such means include a first and a second potential stabilizer switch (e.g., diode or FET). Connected between the substrate and the first main electrode, the first potential stabilizer switch becomes nonconductive in response to a first voltage (first main electrode higher in potential than the second main electrode) and conductive in response to a second voltage (first main electrode less in potential than the second main electrode). Connected between the substrate and the second main electrode on the other hand, the second potential stabilizer switch becomes conductive in response to the first voltage applied between the first and the second main electrode, and nonconductive in response to the second voltage applied therebetween.

As has been mentioned in connection with the prior art, it has been known and practiced to connect the source of the HEMT to the substrate for holding the latter at the same potential as the former. However, in the switching device of symmetrical design now under consideration, either of the two main electrodes serves as source or drain depending upon whether the voltage applied therebetween is positive or negative.

The present invention overcomes this difficulty by the two potential stabilizer switches connected one between each main electrode and the substrate. The potential stabilizer switches function to hold the substrate at a potential close to that of either of the main electrodes functioning as source both when the potential applied between the main electrodes is positive and negative. The resulting potential stabilization of the substrate enhances the reliability of current control between the main electrodes by the two gate means.

The above and other objects, features and advantages of this invention will become more apparent, and the invention itself will best be understood, from a study of the following description and appended claims, with reference had to the attached drawings showing the pertinent prior art and the preferred embodiments of the invention.

BRIEF DESCRIPTION OF THE DRAWINGS

FIG. 17 is a schematic electrical diagram of a still further preferred form of switching device according to the invention which employs FETs in place of the two potential stabilizer diode sections of the embodiment of FIG. 7.

DETAILED DESCRIPTION

Figure 1:
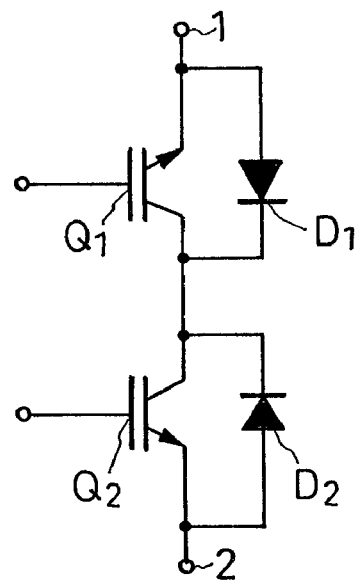
FIG. 1 is a schematic electrical diagram of the noted prior art non-monolithic, multifunction bidirectional switching device.

The first cited prior art bidirectional switch is illustrated in FIG. 1 for a better understanding of the features and advantages of the instant invention. It has two IGBTs $Q_1$ and $Q_2$ connected in inverse series with each other between a pair of main terminals 1 and 2, and two diodes $D_1$ and $D_2$ connected respectively in inverse parallel with the IGBTs. This and other comparable conventional devices possess the drawbacks pointed out earlier herein.

However, the known bidirectional switch of FIG. 1 possesses one strength that adds unmatched versatility and utility thereto. That strength is that the device is capable of operation in any of the following four different modes:

1. First Mode: Both IGBTs $Q_1$ and $Q_2$ turned on thereby causing conduction between the main terminals 1 and 2 during application of both positive and negative voltages.

2. Second Mode: Both IGBTs $Q_1$ and $Q_2$ turned off thereby causing nonconduction between the main terminals 1 and 2 during application of both positive and negative voltages.

3. Third Mode: The first IGBT $Q_1$ turned off, and the second IGBT $Q_2$ turned on, thereby making only the first diode $D_1$ functional.

4. Fourth Mode: The first IGBT $Q_1$ turned on, and the second IGBT $Q_2$ turned off, thereby making only the second diode $D_2$ functional.

The bidirectional switch according to WO 2005/079370 A2, supra, is incapable of the Third and Fourth Modes. This deficiency matters because these two modes are of particular utility for regenerating the energy stored on an inductor contained in an electric circuit under the control of the bidirectional switch. This and other noted shortcomings of the prior art are totally absent from the solid-state switching device according to the present invention, which will be disclosed in detail hereinbelow in terms of several preferred forms.

Figure 2:
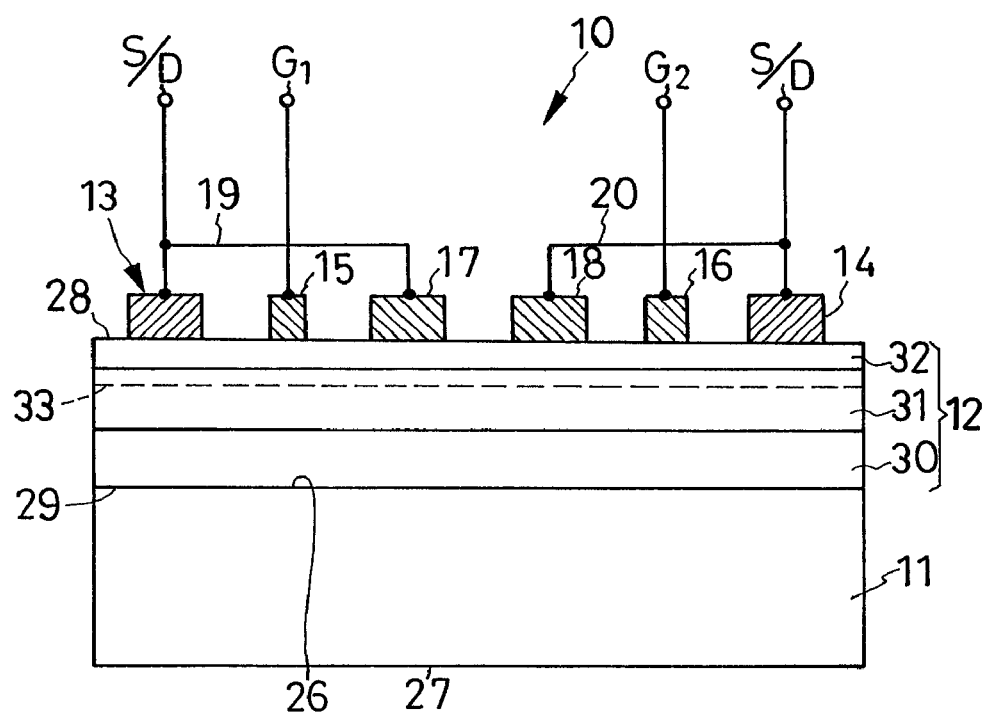
FIG. 2 is a schematic electrical diagram showing the monolithic, multifunction solid-state switching device of this invention in its perhaps simplest form.
Figure 3:
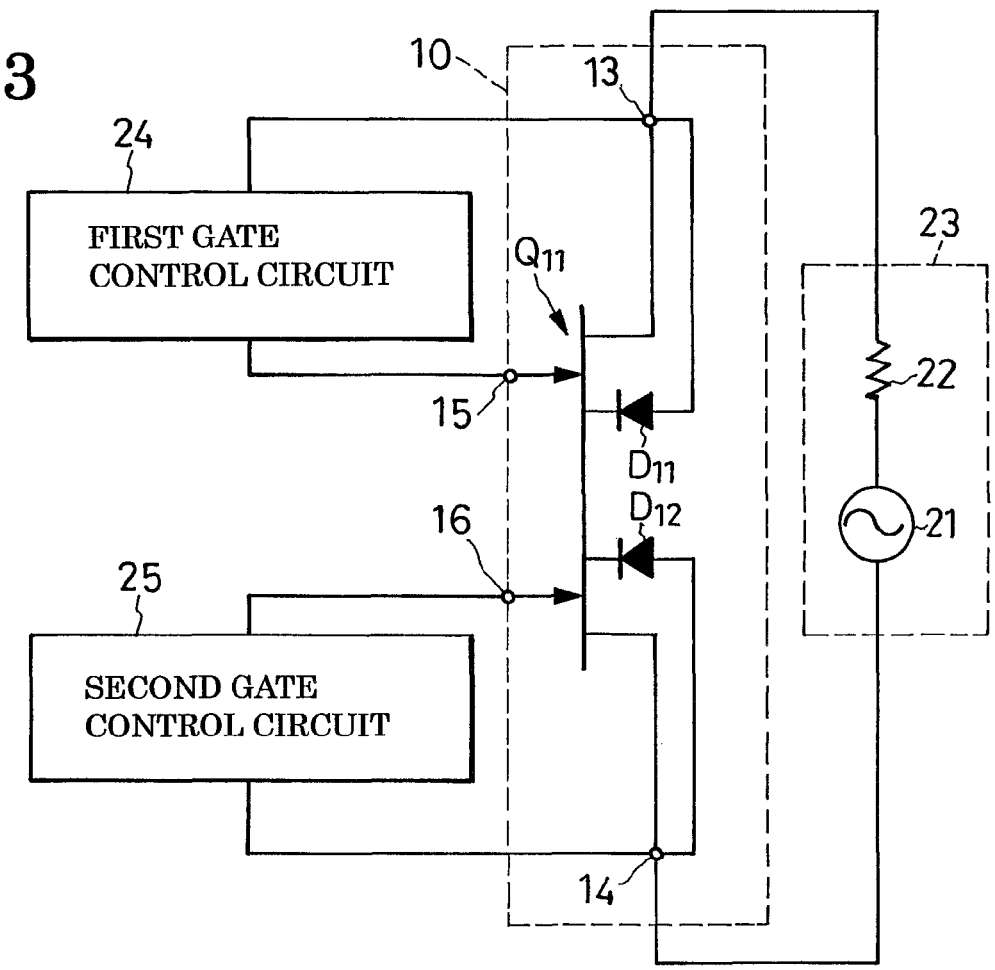
FIG. 3 is an equivalent circuit diagram, partly in block form, of the switching device of FIG. 2 shown together with an electric circuit under the switching control of the device and with gate control circuits for gating control of the device.
Figure 4:
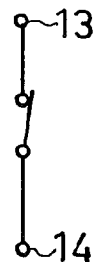
FIG. 4, consisting of (A) through (D), is a set of circuit diagrams explanatory of the operation of the switching device of FIG. 2 in four different modes.
Figure 4:
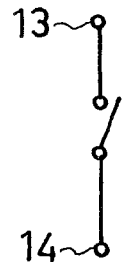
Figure 4:
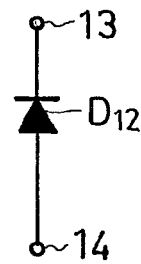
Figure 4:
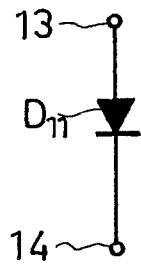

Embodiment of FIGS. 2-4

The first preferred embodiment of the invention is shown in FIG. 2 in terms of a monolithic, bidirectional semiconductor switching device generally designated 10. Broadly, the representative switching device 10 comprises:

1. A substrate 11 of electrically conducting silicon material.
2. A triple-layered semiconductor body or main semiconductor region 12 grown on the substrate 11 for providing a current-carrying channel.
3. A first and a second main (source/drain) electrode 13 and 14 in spaced-apart positions on the main semiconductor region 12.
4. A first and a second gate electrode 15 and 16 disposed between the main electrodes 13 and 14 on the main semiconductor region 12 for on/off control of the current-carrying channel.
5. A first and a second diode-forming electrode 17 and 18 disposed further between the gate electrodes 15 and 16 on the main semiconductor region 12 for providing a first and a second diode in combination with the main semiconductor region 12 and the first and the second main electrode 13 and 14.
6. A first and a second conductor 19 and 20 electrically connecting the first and the second diode-forming electrode 17 and 18 to the first and the second main electrode 13 and 14 respectively.

Before proceeding further with the detailed description of FIG. 2, reference may be briefly had to FIG. 3 for a consideration of how the representative switching device 10 is electrically circuited. The switching device 10 is herein shown as an equivalent electric circuit in combination with an electric circuit 23 under switching control thereby and a first and a second gate control circuit 24 and 25 for gating control of the switching device.

Referring more specifically to FIG. 3, the switching device 10 is equivalently shown as a combination of a HEMT $Q_{11}$, which is a type of FET, and two schottky diodes $D_{11}$ and $D_{12}$. The HEMT $Q_{11}$, forming the primary component of the switching device 10, and schottky diodes $D_1$ and $D_2$ are physically configured as will be later described in detail with reference to FIG. 2. The first gate control circuit 24 is connected between first main electrode 13 and first gate electrode 15, and the second gate control circuit 25 between second main electrode 14 and second gate electrode 16. The electric circuit 23 is shown as comprising an AC power supply 21 and load 22. The first main electrode 13 is connected via the load 22 to one terminal of the AC power supply 21, and the second main electrode 14 is connected directly to the other terminal of the AC power supply 21.

With reference back to FIG. 2 the substrate 11 with its pair of opposite major surfaces 26 and 27 provides a basis for epitaxial growth of the main semiconductor region 12, as well as a mechanical support therefor. From a viewpoint of economy in manufacturing cost, the substrate 11 is made from monocrystalline electroconductive silicon in this particular embodiment, although it might also be made from a semiconductor such as silicon carbide or from an insulator such as sapphire or ceramics.

The main semiconductor region 12 is shown as a lamination of a buffer 30, first semiconductor layer 31, and second semiconductor layer 32. Since the switching device 10 incorporates the HEMT $Q_{11}$, FIG. 3, as its primary component in this embodiment, the first semiconductor layer 31 will be hereinafter referred to as the electron transit layer, and the second semiconductor layer 32 as the electron supply layer. The main semiconductor region 12 as a whole has a first major surface 28 facing away from the substrate 11 and a second major surface 29 held against the first major surface 26 of the substrate.

The buffer 30 of the main semiconductor region 12 is formed by growing a semiconducting nitride in vapor phase on the first major surface 26 of the substrate 11 by any known or suitable method such as metalorganic chemical vapor deposition (MOCVD) also known as metalorganic vapor phase epitaxy (MOVPE). In practice the buffer 30 may be either mono- or multi-layered. The multilayer option may comprise, for example, a desired number of alternations of an aluminum nitride (AlN) layer and a gallium nitride (GaN) layer. However, being not too closely associated with the operations of the HEMT $Q_{11}$ and diodes $D_{11}$ and $D_{12}$ of this switching device 10, the buffer 30 is eliminable. Also, the AlN and GaN layers of the buffer 30 are replaceable by other semiconducting nitrides or Groups III-V compounds.

Directly overlying the buffer 30 is the electron transit layer 31 which is made by MOCVD from an undoped semiconducting nitride to a thickness of, say, 0.3-10.0 micrometers. As indicated by the broken line labeled 33, the electron transit layer 31 provides, in coaction with the overlying electron supply layer 32 yet to be detailed, what is known in the art as two-dimensional electron gas (2DEG) 33 along the heterojunction therebetween. The 2DEG 33 is highly conductive, providing a current-carrying channel parallel to the major surface 28 of the main semiconductor region 12.

The semiconducting nitrides adoptable for the electron transit layer 31 are generally defined as:

where the subscripts a and b are both numerals that are equal to or greater than zero and less than one. Other semiconducting compounds might be employed for the electron transit layer 31 as well.

The electron supply layer 32 of the main semiconductor region 12 is of another semiconducting nitride deposited on the electron transit layer 31 by MOCVD to a thickness of 5-100 nanometers. The semiconducting nitrides for the electron supply layer 32 are greater in bandgap, and less in lattice constant, than those for the underlying electron transit layer 31.

Broadly, the electron supply layer 32 may be made from any of the semiconducting nitrides that are generally expressible by the formula:

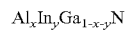

where the subscript x is a numeral that is greater than zero and less than one, and the subscript y is a numeral that is equal to or greater than zero and less than one. Alternatively, the electron supply layer 32 may be made from n-doped, instead of undoped, $Al_xIn_yGa_{1-x-y}N$, from semiconducting nitrides of different compositions, or from other semiconducting compounds.

With the electron transit layer 31 placed in a heterojunction with the electron supply layer 32, the latter being greater in bandgap and less in lattice constant than the former, piezoelectric polarization takes place in the electron supply layer. The electron supply layer 32 also undergoes spontaneous polarization. These polarizations of the electron supply layer 32 results in the appearance of the 2DEG 33 in the electron transit layer 31 along its interface with the electron supply layer 32.

The two gate electrodes 15 and 16 on the surface 28 of the main semiconductor region 12 are both constituents of the HEMT $Q_{11}$, FIG. 3. When the first gate electrode 15 is zero in potential with respect to the first main electrode 13 functioning as source, that is, normally, the 2DEG 33 is not to disappear from under the first gate electrode. The 2DEG 33 does not disappear, either, from under the second gate electrode 16 when this second gate electrode is zero in potential with respect to the second main electrode 14 functioning as source. The HEMT $Q_{11}$ is normally on.

The two main electrodes 13 and 14 both make ohmic contact with the surface 28 of the main semiconductor region 12. These main electrodes 13 and 14 are both made from a metal or metals, preferably a lamination of titanium and aluminum layers, that are capable of ohmic contact with the main semiconductor region 12. It is understood that the main electrodes 13 and 14 are electrically coupled to the 2DEG 33 via the electron supply layer 32.

According to a feature of this invention, the first main electrode 13 serves not only as the source or drain of the BEMT $Q_{11}$ but additionally as the cathode of the second schottky diode $D_{12}$. The second main electrode 14 likewise serves not only as the source or drain of the HEMT $Q_{11}$ but also as the cathode of the first schottky diode $D_{11}$.

For gating the current flow between the two main electrodes 13 and 14, the gate electrodes 15 and 16 are positioned intermediate these main electrodes on the surface 28 of the main semiconductor region 12 in schottky contact therewith. The first gate electrode 15 is disposed closer to the first main electrode 13 than to the second main electrode 14, and the second gate electrode 16 is disposed between first gate electrode 15 and second main electrode 14. These gate electrodes 15 and 16 are also made from suitable metal, preferably in the form of a lamination of nickel and gold layers or of platinum and gold layers. It is recommended that the gate electrodes 15 and 16 be placed symmetrically with respect to the midpoint between the two main electrodes 13 and 14 in order for the HEMT 11 to be of equal antivoltage strength bidirectionally.

Forming a part of the first schottky diode $D_{11}$, FIG. 3, which constitutes a feature of the invention, the first diode-forming electrode 17 is disposed opposite the first main electrode 13 across the first gate electrode 15, and between the first gate electrode 15 and second diode-forming electrode 18, on the surface 28 of the main semiconductor region 12. Made from the same material as, and concurrently with, the gate electrodes 15 and 16 and second diode-forming electrode 18, the first diode-forming electrode 17 makes schottky contact with the main semiconductor region 12, although it, as well as the second diode-forming electrode 18, could be made from a different material and independently without departing from the scope of the invention.

The first diode-forming electrode 17 makes up the first schottky diode $D_{11}$ in combination with the main semiconductor region 12 and second main electrode 14. The anode of this first diode $D_{11}$ is therefore the first diode-forming electrode 17, and its cathode the second main electrode 14. Thus the second main electrode 14 serves as both the source or drain of the HEMT $Q_{11}$ and the cathode of the first diode $D_{11}$.

The second diode-forming electrode 18, a part of the second schottky diode $D_{12}$, is disposed opposite the second main electrode 14 across the second gate electrode 16, and between this second gate electrode 16 and the first diode-forming electrode 17, on the surface 28 of the main semiconductor region 12. This second diode-forming electrode 18 is also made from the same material as, and concurrently with, the gate electrodes 15 and 16 and first diode-forming electrode 17 and makes schottky contact with the main semiconductor region 12, although it, and perhaps the first diode-forming electrode 17, could be made independently from a different material.

The second diode-forming electrode 18 constitutes the second schottky diode $D_{12}$ in combination with the main semiconductor region 12 and first main electrode 13. The anode of this second diode $D_{12}$ is therefore the second diode-forming electrode 18, and its cathode the first main electrode 13. Thus the first main electrode 13 serves as both the source or drain of the HEMT $Q_{11}$ and the cathode of the second diode $D_{12}$.

It is to be noted that the illustrated positioning of the two diode-forming electrodes 17 and 18 is not mandatory. They may instead be disposed anywhere between the two gate electrodes 15 and 16, and their positions are even interchangeable.

The first diode-forming electrode 17 is electrically connected to the first main electrode 13 via the first conductor 19, and the second diode-forming electrode 18 to the second main electrode 14 via the second conductor 20. In practice the conductors 19 and 20 may either be wires or conductive layers formed on the main semiconductor region 12 via an insulating film.

Operation of the FIGS. 2-4 Embodiment

The switching device 10, described in detail hereinbefore with reference to FIGS. 2 and 3, may be put to use in either of the aforesaid four different modes. These modes are illustrated at (A) through (D) in FIG. 4. As has been stated, this switching device 10 incorporates the normally-on HEMT $Q_{11}$ as its primary component. The following four modes of operation presuppose the presence of the normally-on HEMT $Q_{11}$ as the primary component of the switching device 10.

1. Switch On Mode, FIG. 4(A):

Voltages sufficiently high (e.g., either equal to or greater than zero) to keep up the 2DEG 33 are applied from gate control circuits 24 and 25 to gate electrodes 15 and 16, thereby permitting conduction between the two main electrodes 13 and 14 via the 2DEG 33.

2. Switch Off Mode, FIG. 4(B):

Voltages sufficiently low (e.g., less than zero) to pinch off the 2DEG 33 are applied from gate control circuits 24 and 25 to gate electrodes 15 and 16 thereby turning off the conduction between the main electrodes 13 and 14.

3. Negative Current Mode, FIG. 4(C):

A voltage sufficiently high to keep up the 2DEG 33 is applied from first gate control circuit 24 to first gate electrode 15, and a voltage sufficiently low to pinch off the 2DEG 33 is applied from second gate control circuit 25 to second gate electrode 16, thereby electrically connecting only the second diode $D_{12}$ between the main electrodes 13 and 14.

4. Positive Current Mode, FIG. 4(D):

A voltage sufficiently low to pinch off the 2DEG 33 is applied from first gate control circuit 24 to first gate electrode 15, and a voltage sufficiently high to keep up the 2DEG 33 is applied from second gate control circuit 25 to second gate electrode 16, thereby electrically connecting only the first diode $D_{11}$ between the main electrodes 13 and 14.

How the switching device 10 is put to use in any of these modes will become apparent from a reconsideration of FIG. 3. The electric circuit 23 to be placed under switching control by the device 10 may be connected between the pair of main electrodes 13 and 14. The first gate control circuit 24 may be connected between first main electrode 13 and first gate electrode 15, and the second gate control circuit 25 between second main electrode 14 and second gate electrode 16.

For operating the system of FIG. 3 in Switch On Mode, voltages sufficiently high to keep up the 2DEG 33 may be applied as aforesaid from gate control circuits 24 and 25 to gate electrodes 15 and 16. More specifically, the first gate control circuit 24 may be caused to make the potential of the first gate electrode 15 equal to or higher than that of the first main electrode 13 which is to function as source. The second gate control circuit 25 may likewise be caused to make the potential of the second gate electrode 16 equal to or higher than that of the second main electrode 14 which is to function as source.

Now, when the AC voltage from the source 21 is positive (first main electrode 13 higher in potential than the second 14), there will be a current flow along the path sequentially comprising the first main electrode 13, electron supply layer 32, 2DEG 33, electron supply layer 32, and second main electrode 14. On the other hand, when the AC voltage from the source 21 is negative (first main electrode 13 less in potential than the second 14), a current will flow along the path sequentially comprising the second main electrode 14, electron supply layer 32, 2DEG 33, electron supply layer 32, and first main electrode 13.

In this Switch On Mode the beginning and end of each conducting period of the switching device 10 may be set at any desired points in the cycle of the AC voltage from its source 21. Use of the switching device 10 in Switch On Mode is also possible if a DC power supply is connected in place of the AC power supply 21.

For operation in Switch Off Mode, voltages sufficiently low to interrupt the 2DEG 33 may be applied as aforesaid from gate control circuits 24 and 25 to gate electrodes 15 and 16. More specifically, the first gate control circuit 24 may be caused to make the potential of the first gate electrode 15 lower than that of the first main electrode 13 which is to function as source. The second gate control circuit 25 may likewise be caused to make the potential of the second gate electrode 16 lower than that of the second main electrode 14 which is to function as source.

The result will be a depletion of electrons from those parts of the electron transit layer 31 which underlie the gate electrodes 15 and 16. With the 2DEG 33 thus interrupted, there will be no current path between the main electrodes 13 and 14. There will be no current flow through the diode-forming electrodes 17 and 18, either, since these electrodes are disposed between the gate electrodes 15 and 16 and oppositely oriented between the main electrodes 13 and 14.

The switching device 10 may be set off at any desired point on the AC voltage from its source 21 in this Switch Off Mode.

Use of the switching device 10 in Switch Off Mode is also possible if a DC power supply is connected in place of the AC power supply 21.

For operation in Negative Current Mode the first gate control circuit 24 may be caused to make the potential of the first gate electrode 15 equal to or higher than that of the first main electrode 13 which is to function as source. The second gate control circuit 25 may be caused to put out a second gate control signal for application between second main electrode 14 and second gate electrode 16 whereby the second gate electrode 16 is made less in potential than the second main electrode 14 which is to function as source.

The result will be a pinchoff of the 2DEG 33 under the second gate electrode 16, but not under the first gate electrode 15. As a consequence, when the AC voltage from its source 21 is positive (first main electrode 13 higher in potential than the second 14), the second diode $D_{12}$ comprising the second diode-forming electrode 18 will be reverse biased, and the 2DEG 33 will have a hiatus under the second gate electrode 16. Although there will be no forward current flow between the main electrodes 13 and 14, a current will flow along the path sequentially comprising the second diode-forming electrode 18, electron supply layer 32, 2DEG 33, electron supply layer 32, and first main electrode 13 when the AC supply voltage is negative, because then the second diode $D_{12}$ will be forward biased. Disposed between the two gate electrodes 15 and 16, the second diode-forming electrode 18 permits negative current flow therethrough in the presence of the hiatus in the 2DEG 33 under the second gate electrode 16.

Possibly, the electric circuit 23 depicted in FIG. 3 may be replaced by an inverter circuit, electric motor driver circuit, or like inductive circuit. As is well known, an inductive circuit stores and releases energy. Should such energy release occur in Negative Current Mode from the second main electrode 14 toward the first 13, there will be a circulatory or regenerative current flow through the second diode $D_{12}$.

Operation in Positive Current Mode is possible by causing the second gate control circuit 25 to make the potential of the second gate electrode 16 equal to or greater than that of the second main electrode 14 which is to function as source. Further the first gate control circuit 24 may be caused to put out a first gate control signal for application between first main electrode 13 and first gate electrode 15 whereby the first gate electrode 15 is made less in potential than the first main electrode 13 which is to function as source.

Thereupon the 2DEG 33 will be pinched off under the first gate electrode 15 but not under the second gate electrode 16. In this Positive Current Mode, therefore, when the AC voltage from its source 21 is negative (first main electrode 13 less in potential than the second 14), the first diode $D_{11}$ comprising the first diode-forming electrode 17 will be reverse biased, blocking negative current flow between the pair of main electrodes 13 and 14.

On the other hand, when the AC supply voltage is positive (first main electrode 13 higher in potential than the second 14), the first diode $D_{11}$ will be forward biased, permitting current flow along the path sequentially comprising the first diode-forming electrode 17, electron supply layer 32, 2DEG 33, electron supply layer 32, and second main electrode 14. It will be noted that forward current flow is possible through the first diode-forming electrode 17 in the face of the breaking of the 2DEG 33 under the first gate electrode 15. This is because the forming diode-forming electrode 17 lies opposite the first main electrode 13 across the first gate electrode 15.

As has been mentioned in connection with Negative Current Mode, the electric circuit 23, FIG. 3, is replaceable with an inverter circuit, electric motor driver circuit, or like inductive circuit. In cases where energy release from such an inductive circuit occurs in Positive Current Mode from first main electrode 13 toward the second 14, there will be a circulatory or regenerative current flow through the first diode $D_{11}$.

The advantages gained over the prior art by the switching device 10, described hereinbefore with reference to FIGS. 2-4, may be recapitulated as follows:

1. The switching device 10 has the diode-forming electrodes 17 and 18 formed on the semiconductor body for monolithically incorporating the diodes $D_{11}$ and $D_{12}$ in substitution for the discrete diodes $D_1$ and $D_2$, FIG. 1, of the prior art multifunction bidirectional switch. The diodes $D_{11}$ and $D_{12}$ thus forming integral parts of the switching device 10 confer greater versatility on the device according to the present invention, enabling the same to operate in both Positive and Negative Current Modes in addition to Switch On and Switch Off Modes.
2. Substantive savings in size and manufacturing cost are accomplished by the simple construction of the switching device 10, with a minimal number of electrodes 13-18 all deposited on the same surface 28 of the main semiconductor region 12.
3. The diode-forming electrodes 17 and 18 are both schottky diodes similar to the gate electrodes 15 and 16. All these schottky diodes are capable of conjoint fabrication, making the switching device 10 manufacturable more easily and inexpensively.

Figure 5:
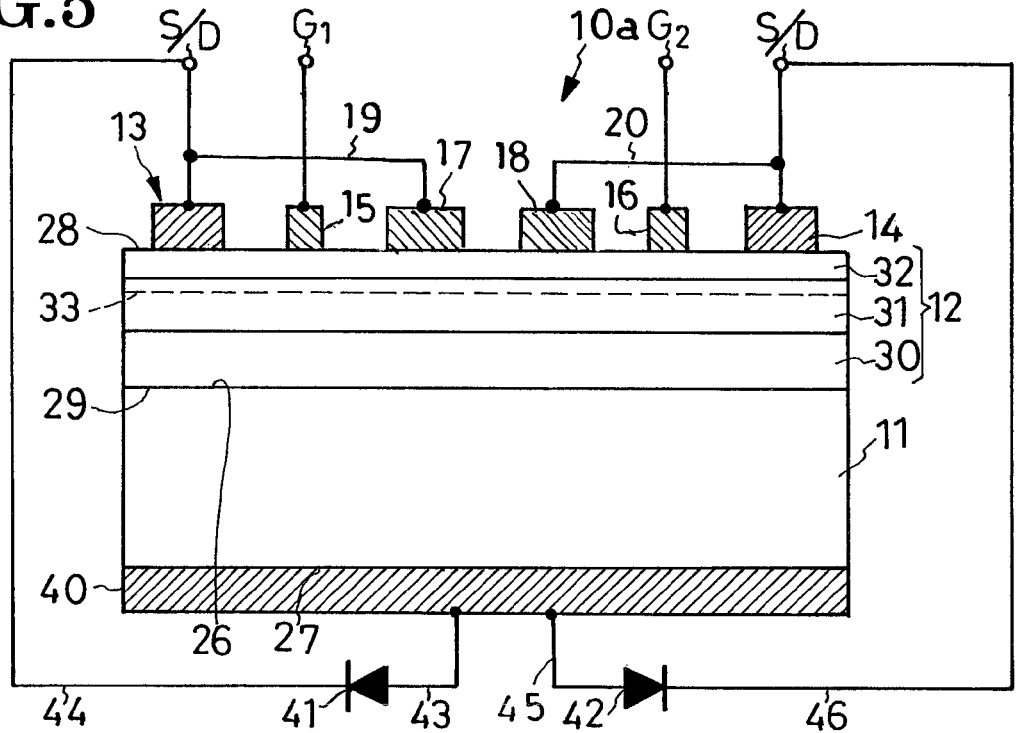
FIG. 5 is a schematic electrical diagram of another preferred form of switching device according to the invention in which two discrete potential stabilizer diodes are combined with the device of FIG. 2 for stabilizing the potential of the substrate.
Figure 6:
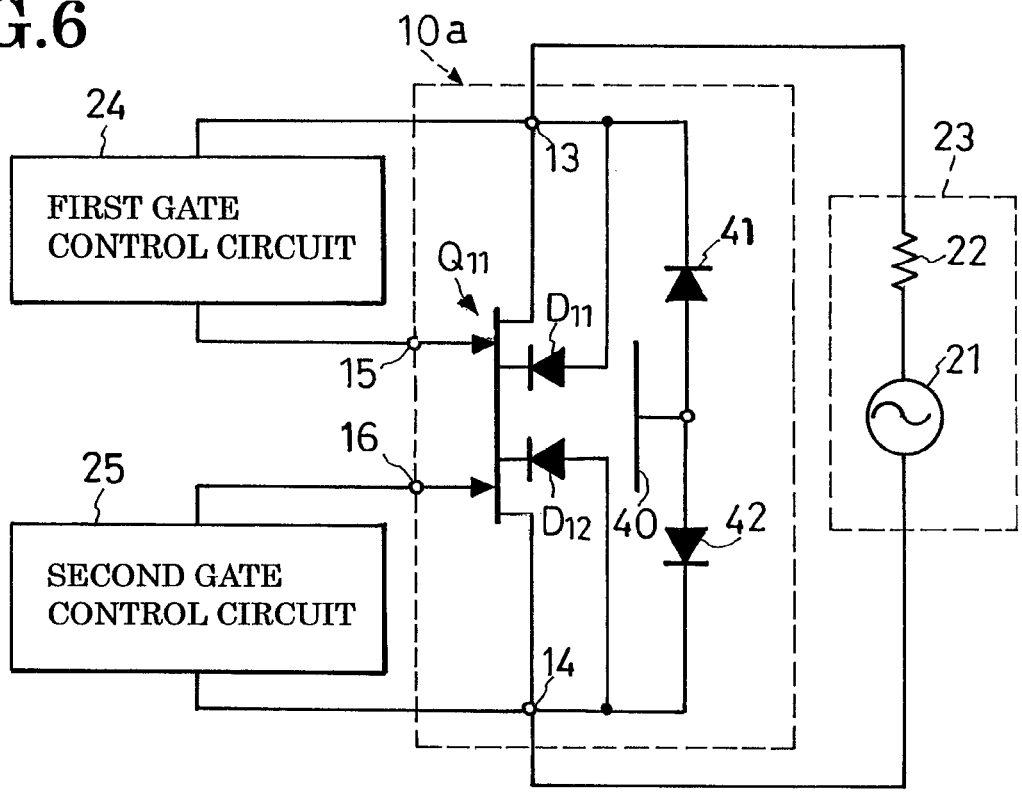
FIG. 6 is an equivalent circuit diagram, partly in block form, of the switching device of FIG. 5 shown together with an electric circuit under the switching control of the device and with gate control circuits for gating control of the device.

Embodiment of FIGS. 5 and 6

The second preferred form of the switching device according to the invention, shown at $10_a$ in FIG. 5, differs from the device of FIG. 2 in additionally comprising means for potential stabilization of the substrate 11. Such means include a substrate electrode 40 on the substrate 11 and two separate potential stabilizer diodes 41 and 42 which are herein shown as not monolithically integrated with the rest of the device $10_a$. The potential stabilizer diodes 41 and 42 as the potential stabilizer switches are electrically connected respectively between the pair of main electrodes 13 and 14 and the substrate electrode 40. All the other details of construction are as previously set forth with reference to FIG. 2.

The substrate electrode 40, also known as the back electrode, is a sheet of metal attached to the second major surface 27 of the substrate 11 in electrically conducting relationship thereto, the substrate 11 being understood to be of electrically conducting material in this embodiment of the invention. The substrate electrode 40 serves for stabilization of the potential of the substrate 11 in cooperation with the potential stabilizer diodes 41 and 42. Coupled to the electroconductive substrate 11 both mechanically and electrically, the substrate electrode 40 might be considered either part of the substrate or means through which the potential stabilizer diodes 41 and 42 are electrically coupled to the substrate.

The two potential stabilizer diodes 41 and 42 are both schottky diodes. The first potential stabilizer diode 41 has its anode connected to the substrate 11 via a conductor 43 and the substrate electrode 40, and its cathode connected to the first main electrode 13 via another conductor 44. The second potential stabilizer diode 42 has its anode connected to the substrate 11 via a conductor 45 and the substrate electrode 40, and its cathode connected to the second main electrode 14 via a conductor 46.

Electrically, as will be noted from the equivalent electrical circuit diagram of the FIG. 5 switching device $10_a$ presented as FIG. 6, the two potential stabilizer diodes 41 and 42 are serially interconnected with their polarities oriented opposite each other. This inverse serial circuit is connected between the pair of main electrodes 13 and 14. The junction between the potential stabilizer diodes 41 and 42 is connected to the substrate electrode 40.

Again as has been set forth in conjunction with the HEMT as heretofore constructed, it has been known to connect its source electrode to the substrate in order to stabilize the substrate potential by holding the same equal to that of the source. The HEMT has thus been rendered more reliable in operation. However, this scheme is not applicable to the semiconductor switches of symmetrical design that are being dealt with by the instant invention, because they differ from the HEMT in some important respects. The first main electrode 13 functions as source when a negative voltage is impressed between the pair of main electrodes 13 and 14, and the second main electrode 14 does so when a positive voltage is impressed therebetween. Neither of these main electrodes 13 and 14 is a permanent source or a permanent drain. The two potential stabilizer diodes 41 and 42 proposed in this embodiment of the invention are a solution to this problem.

With reference to FIG. 6 again, the second potential stabilizer diode 42 is forward biased when a positive voltage (first main electrode 13 higher in potential than the second 14) is applied between the pair of main electrodes 13 and 14. As a result, at this time, the potential of the substrate 11 and substrate electrode 40 is fixed at a value that is higher than that of the potential of the second main electrode (source) 14 by the forward voltage $V_f$ (e.g., 0.7 V) of the second potential stabilizer diode 42.

It is the first potential stabilizer diode 41, on the other hand, that is forward biased when a negative voltage (first main electrode 13 lower in potential than the second 14) is applied between the pair of main electrodes 13 and 14. The potential of the substrate 11 and substrate electrode 40 is stabilized at a value that is higher than that of the first main electrode (source) 13 by the forward voltage $V_f$ (e.g., 0.7 V) of the first potential stabilizer diode 41. Thus is accomplished the stable current control by the HEMT $Q_{11}$ of the switching device $10_a$. Additionally, this switch $10_a$ possesses all the benefits enumerated in conjunction with the first disclosed switching device 10.

Figure 7:
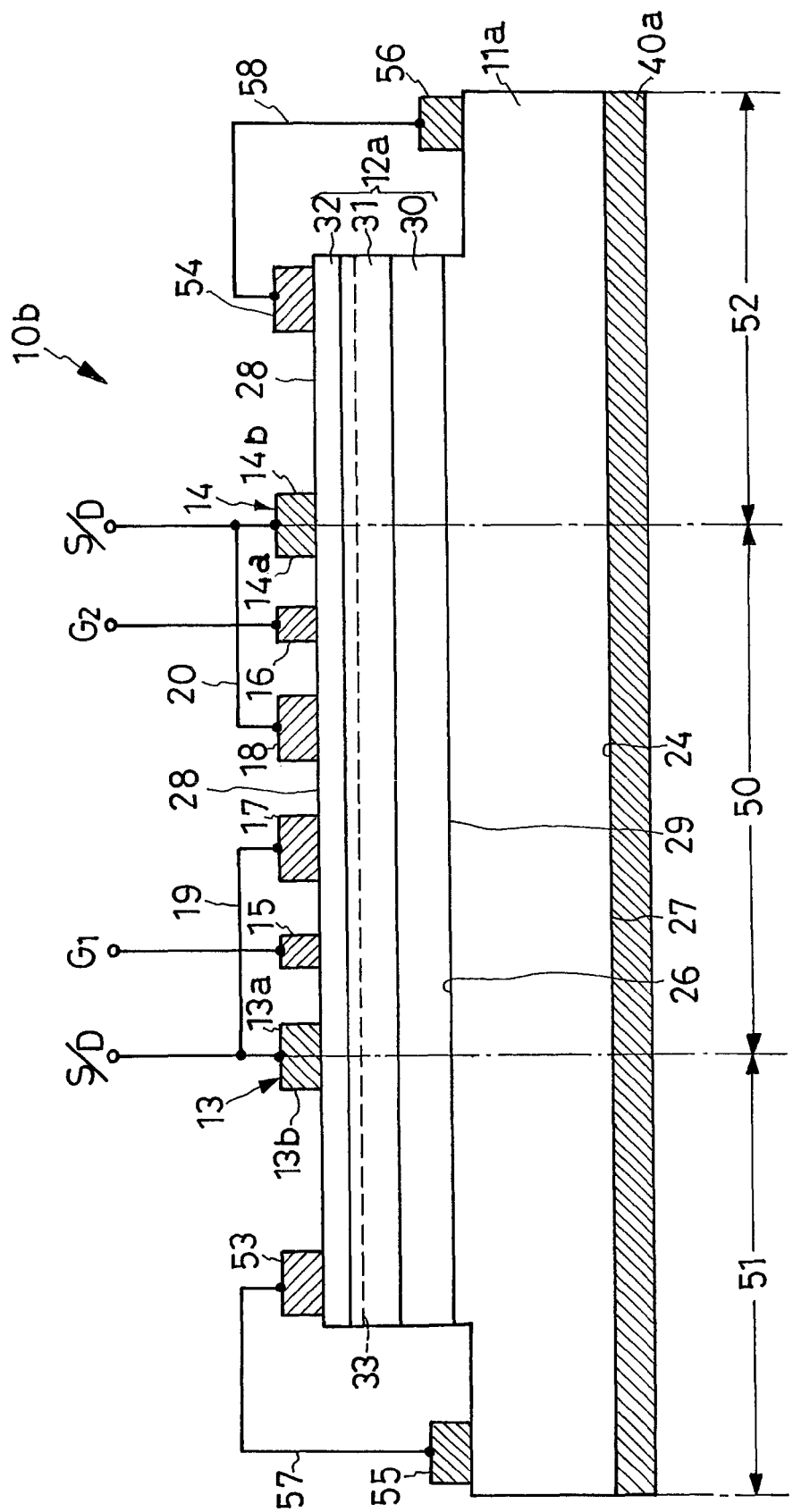
FIG. 7 is a schematic electrical diagram of still another preferred form of switching device according to the invention in which the two discrete potential stabilizer diodes of FIG. 5 are monolithically integrated with the device of FIG. 2.

Embodiment of FIG. 7

Unlike the switching device $10_a$, FIG. 5, in which the two potential stabilizer diodes 41 are discrete units only electrically coupled to the required parts of the device, the switching device $10_b$ disclosed in FIG. 7 integrally incorporates potential stabilizer diodes. This switching device $10_b$ may therefore be envisaged as a monolithic integration of the switching device 10 of FIG. 2 and the two potential stabilizer diodes 41 and 42 of FIG. 5. Thus the switching device $10_b$ is comprised of a main switch section 50 of symmetrical design capable of bidirectional operation and, on its opposite sides, a pair of potential stabilizer diode sections 51 and 52 corresponding to the potential stabilizer diodes 41 and 42 above. The main switch section 50 and potential stabilizer diode sections 51 and 52 are all built on one and the same substrate $11_a$ of electroconductive material.

The main switch section 50 of the switching device $10_b$ is substantially equal in construction to the switching device $10_a$, FIG. 5, minus the potential stabilizer diodes 41 and 42. However, the substrate, main semiconductor region, and substrate electrode, which are designated respectively 11, 12 and 40 in FIG. 5, are redesignated $11_a$, $12_a$ and $40_a$ in FIG. 7 because, here, these parts have lateral extensions forming parts of the potential stabilizer diode sections 51 and 52.

It will also be observed from FIG. 7 that the first main electrode 13 is a one-piece combination of first main electrode part $13_a$, which belongs to the main switch section 50, and cathode part $13_b$ belonging to the first potential stabilizer diode section 51. The second main electrode 14 is also a one-piece combination of second main electrode part $14_a$, which belongs to the main switch section 50, and cathode part $14_b$ belonging to the second potential stabilizer diode section 52. However, the first main electrode part $13_a$ and cathode part $13_b$ need not be of one-piece construction but may be formed separately on the main semiconductor region $12_a$ and electrically interconnected via either a conductor or 2DEG 33. The second main electrode part $14_a$ and cathode $14_b$ need not be of one-piece construction, either, but may be formed separately on the main semiconductor region $12_a$ and electrically interconnected via either a conductor or 2DEG 33.

The first potential stabilizer diode section 51 has a first potential stabilizer diode-forming electrode 53 formed on the surface 28 of the main semiconductor region $12_a$ for providing the first potential stabilizer diode corresponding to that shown at 41 in FIG. 5. The first potential stabilizer diode-forming electrode 53 is disposed opposite the first gate electrode 15 of the main switch section 50 across the first main electrode 13. The second potential stabilizer diode section 52 likewise has a second potential stabilizer diode-forming electrode 54 formed on the surface 28 of the main semiconductor region $12_a$ for providing the second potential stabilizer diode corresponding to that shown at 42 in FIG. 5. The second potential stabilizer diode-forming electrode 54 is disposed opposite the second gate electrode 16 of the main switch section 50 across the second main electrode 14.

The first and the second potential stabilizer diode-forming electrodes 53 and 54 are both in schottky contact with the main semiconductor region $12_a$. The first and the second potential stabilizer diode-forming electrodes 53 and 54 are made from the same material as the first and the second gate electrode 15 and 16 and the first and the second diode-forming electrode 17 and 18 of the main switch section 50. Use of the same material for the electrodes 53 and 53 as for the electrodes 15-18, although not an essential feature of the invention, is nevertheless recommended because then the first and the second potential stabilizer diode-forming electrode 53 and 54 are capable of fabrication in the same manufacturing step as the first and the second gate electrode 15 and 16 and the first and the second diode-forming electrode 17 and 18 of the main switch section 50.

For electrically connecting the first and the second potential stabilizer diode-forming electrode 53 and 54 to the substrate $11_a$, a first and a second bonding pad 55 and 56 are formed respectively on a pair of ledges of the substrate $11_a$ on its opposite sides. Conductors 57 and 58 connect the potential stabilizer diode-forming electrode 53 and 54 to the respective bonding pads 55 and 56. The conductors 57 and 58 may take the form of either wires extending exteriorly of the IC chip or conductive films overlying an insulating layer on the surfaces of the chip. The potential stabilizer diode-forming electrodes 53 and 54 might be connected to the substrate electrode $40_a$ instead of to the substrate $1_a$.

The first main electrode 13 and first potential stabilizer diode-forming electrode 53 constitute in combination with part of the main semiconductor region $12_a$ the first potential stabilizer diode of schottky construction similar to that indicated at 41 in FIGS. 5 and 6. Connected between the substrate $11_a$ and the first main electrode 13, the first potential stabilizer diode functions just like its FIG. 6 counterpart 41

More specifically, upon application of a negative voltage between the pair of main electrodes 13 and 14, the first potential stabilizer diode is forward biased, providing a conductive path comprising the first potential stabilizer diode-forming electrode 53, second semiconductor layer 32 of the main semiconductor region $12_a$, 2DEG 33, second semiconductor layer 32, and first main electrode 13. Thus is the substrate $11_a$ kept higher in potential than the first main electrode (source) 13 by the forward voltage (e.g., 0.7 V) of the first potential stabilizer diode.

The second main electrode 14 and second potential stabilizer diode-forming electrode 54 constitute in combination with part of the main semiconductor region $12_a$ the second potential stabilizer diode of schottky construction similar to that seen at 42 in FIGS. 5 and 6. Connected between the substrate $11_a$ and the second main electrode 14, the second potential stabilizer diode functions just like its FIG. 6 counterpart 42.

More specifically, forward biased upon application of a positive voltage between the pair of main electrodes 13 and 14, the second potential stabilizer diode provides a conductive path extending through the second potential stabilizer diode-forming electrode 54, second semiconductor layer 32 of the main semiconductor region $12_a$, 2DEG 33, second semiconductor layer 32, and second main electrode 14. Thus is the substrate $11_a$ kept higher in potential than the second main electrode (source) 14 by the forward voltage (e.g., 0.7 V) of the second potential stabilizer diode.

It will now be apparent that the discrete potential stabilizer diodes 41 and 42 of the FIG. 5 switching device $10_a$ are monolithically incorporated into this switching device $10_b$ in the form of the potential stabilizer diode sections 51 and 52. The switch $10_b$ is therefore more compact in size, less expensive of manufacture, and easier and more convenient of use than its FIG. 5 counterpart $10_a$.

Another strength of this switching device $10_b$ is that the first and the second potential stabilizer diode-forming electrodes 53 and 54 of the potential stabilizer diode sections 51 and 52 are made from the same material as the first and the second gate electrode 15 and 16 and the first and the second diode-forming electrode 17 and 18 of the main switch section 50. The fabrication of these additional electrodes 53 and 54 will therefore be far easier and less time-consuming than if they were of different material from the preexisting electrodes 15-18.

Figure 8:
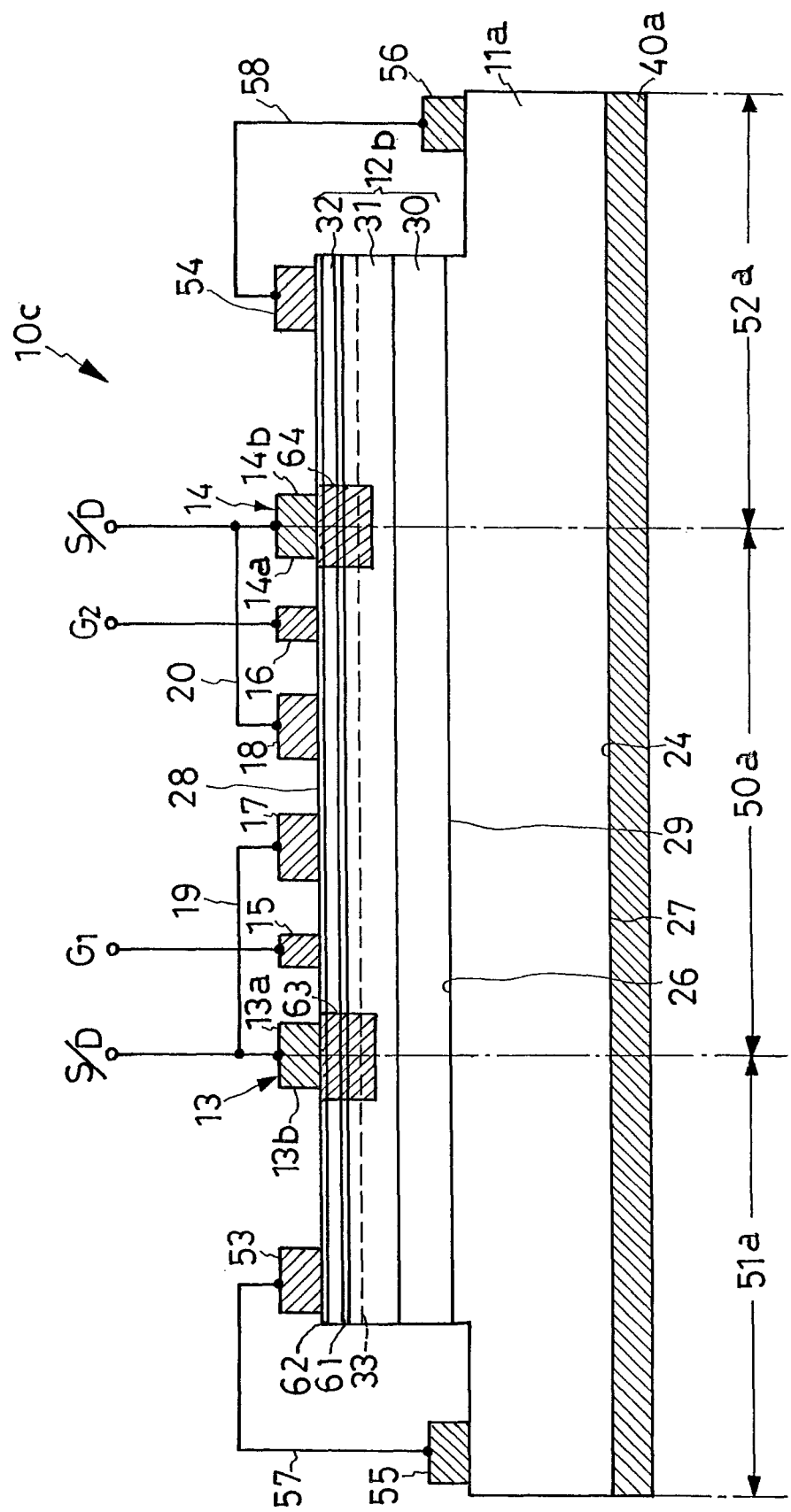
FIG. 8 is a schematic electrical diagram of yet another preferred form of switching device according to the invention which is akin in construction to the embodiment of FIG. 7 except for some modifications introduced into the main semiconductor region.

Embodiment of FIG. 8

Here is shown a switching device $10_c$ which features some modifications introduced into its main semiconductor region $12_b$. All but the main semiconductor region $12_b$ of this switching device $10_c$ is constructed as described above in connection with its FIG. 7 counterpart The main semiconductor region $12_b$ of the switch $10_c$ differs from that of FIG. 7 in additionally comprising: (a) a spacer layer 61 of undoped AlN, undoped AlInGaN or the like interposed between electron transit layer 31 and electron supply layer 32; (b) a cap layer 62 of undoped AlGaN or the like atop the main semiconductor region $12_b$ for surface charge control; and (c) two n-doped contact regions 63 and 64, indicated by the hatchings, which are formed in parts of the layers 31 and 32 of the main semiconductor region $12_b$ so as to underlie the pair of main electrodes 13 and 14.

The spacer layer 61 functions to retard a drop in electron mobility at the 2DEG 33. The contact regions 64 and 64 serve to reduce the contact resistance of the main electrodes 13 and 14 with the main semiconductor region $12_b$. Both spacer layer 61 and cap layer 62 extend throughout the main switch section $50_a$ and potential stabilizer diode sections $51_a$ and $52_a$ of the main semiconductor region $12_b$. The modified main semiconductor region $12_b$ is substitutable for the main semiconductor region 12 in the embodiments of FIGS. 2 and 5.

Figure 9:
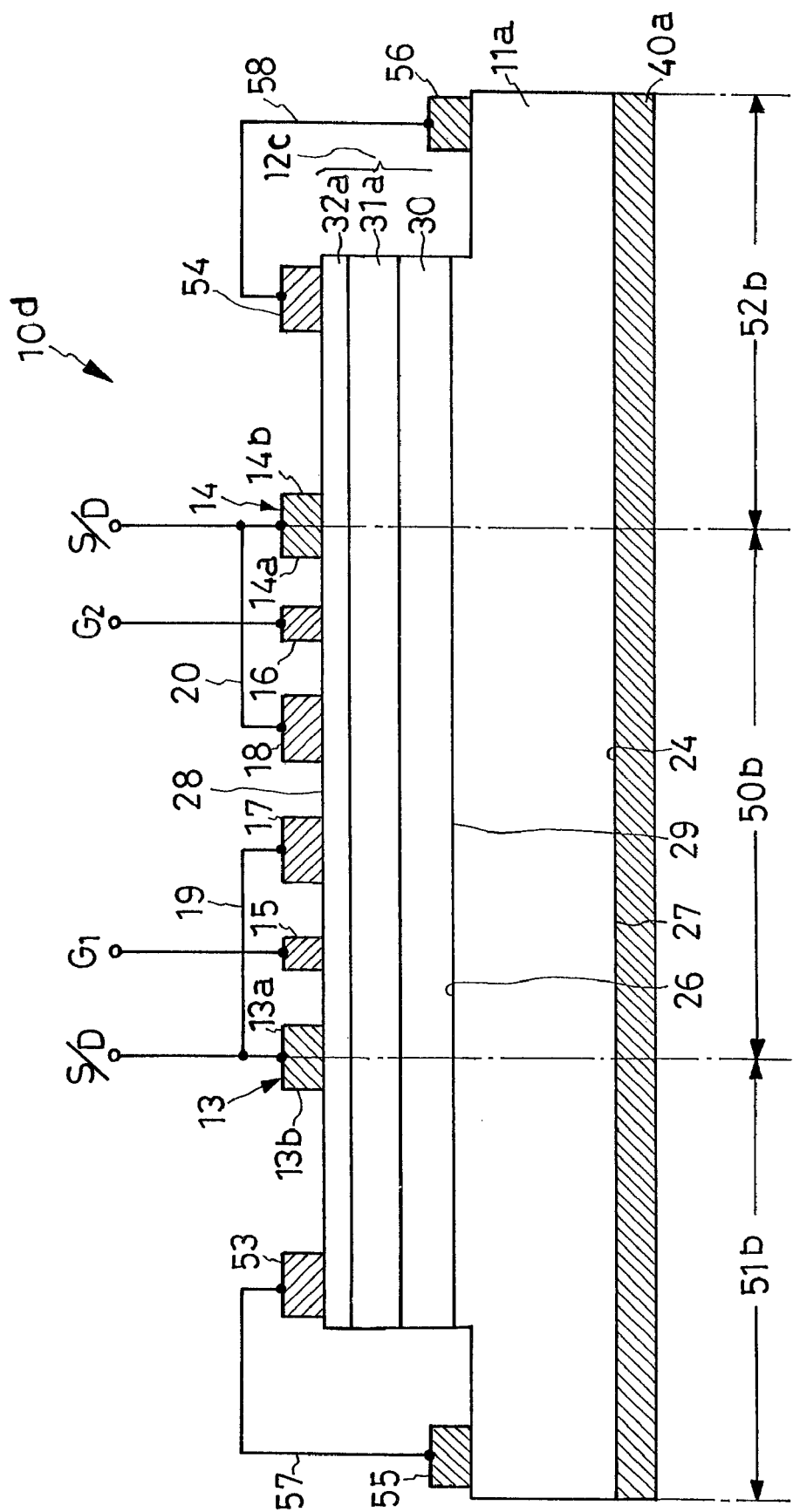
FIG. 9 is a schematic electrical diagram of a further preferred form of switching device according to the invention which also is similar in construction to the embodiment of FIG. 7 except that the main semiconductor region is reconfigured to provide a metal semiconductor field effect transistor as the primary component of the device.

Embodiment of FIG. 9

Another modified main semiconductor region $12_c$ is built into this switching device $10_d$, which is otherwise analogous with its FIG. 7 counterpart $10_b$. Designed to provide a metal semiconductor field effect transistor (MESFET) as the primary component of the switching device $10_d$, the main semiconductor region $12_c$ comprises, in addition to the buffer 30, a first semiconductor layer $31_a$ of undoped GaN and, thereover, a second semiconductor layer $32_a$ of n-doped GaN. The second semiconductor layer $32_a$ is formed by doping an n-type impurity (e.g., silicon) into a part of the first semiconductor layer $31_a$. The switching device $10_d$ is electroded just like that of FIG. 7.

Since the primary component of this switching device $10_d$ is a MESFET in this embodiment of the invention, it is the n-GaN second semiconductor layer $32_a$ itself of the main semiconductor region $12_c$ that provides the current-carrying channel. This channel is uninterrupted when the schottky gate electrodes 15 and 16 are equal in potential to either of the main electrodes 13 and 14 functioning as source, that is, normally, or when they are higher in potential than a threshold. The channel is interrupted by virtue of the field effect when the gate electrodes 15 and 16 are less in potential than either of the main electrode 13 or 14 functioning as source, or less in potential than a threshold. Functionally, therefore, the MESFET is equivalent to the HEMT $Q_{11}$ of FIG. 3 or 6.

Making schottky contact with the second semiconductor layer $32_a$ of the main semiconductor region $12_c$, the diode-forming electrodes 17 and 18 serve to provide schottky diodes similar to those indicated at $D_{11}$ and $D_{12}$ in FIG. 6. The potential stabilizer diode-forming electrodes 53 and 54 also make schottky contact with the second semiconductor region $32_a$ of the main semiconductor region $12_c$ in order to provide potential stabilizer diodes which function like those seen at 41 and 42 in FIGS. 5 and 6.

Being electrically circuited as equivalently depicted at $10_a$ in FIG. 6, the switching device $10_d$ of FIG. 9 possesses the same merits as do the devices $10_a$ and $10_b$ of FIGS. 5 and 7. The HBEMT-type devices 10 and $10_a$ of FIGS. 2 and 5 are likewise modifiable into the MESFET-type device $10_d$.

Figure 10:
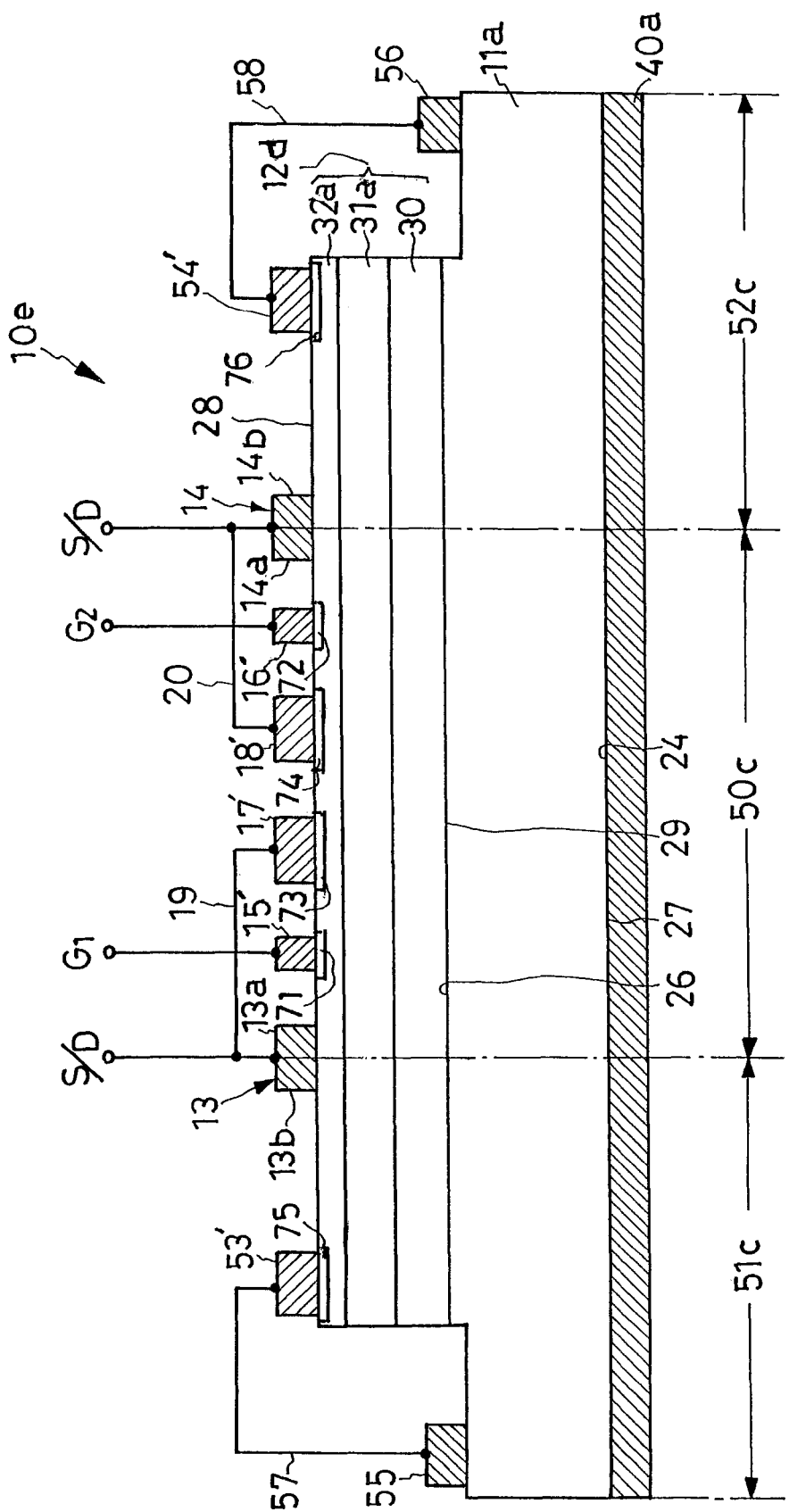
FIG. 10 is a schematic electrical diagram of a further preferred form of switching device according to the invention which is of the same make as the embodiment of FIG. 9 except for electrode contacts through which some selected electrodes of the device contact the main semiconductor region.

Embodiment of FIG. 10

Although largely of the same make as its FIG. 9 counterpart $10_d$, the switching device $10_e$ of FIG. 10 differs therefrom in its main semiconductor region $12_d$, two gate electrodes 15' and 16', two diode-forming electrodes 16' and 17', and two potential stabilizer diode-forming electrodes 53' and 54'.

The main semiconductor region $12_d$ of the switching device $10_e$ has six pn-junction-forming layers 71, 72, 73, 74, 75 and 76 of a p-type semiconductor embedded in, and exposed from, the surface of the n-type second semiconductor layer $32_a$, although all these pn-junction-forming layers could all be formed over that surface without any such embedment. The first two pn-junction-forming layers 71 and 72 underlie the gate electrodes 15' and 16', respectively. The second two pn-junction-forming layers 73 and 74 underlie the diode-forming electrodes 17' and 18', respectively. The third two pn-junction-forming layers 75 and 76 underlie the potential stabilizer diode-forming electrodes 53' and 54', respectively. The gate electrodes 15' and 16', diode-forming electrodes 17' and 18', and potential stabilizer diode-forming electrodes 53' and 54' all make ohmic contact with the respective pn-junction-forming layers or p-type semiconductor layers 71-76.

The first two pn-junction-forming layers 71 and 72 serve as the gates of junction field effect transistors (JFETs) formed in the main switch section $50_c$ of the switching device $10_e$. The second two pn-junction-forming layers 73 and 74 serve for creation of pn-junction diodes corresponding to the diode $D_{11}$ and $D_{12}$ of FIG. 6. The third two pn-junction-forming layers 75 and 75 serve for creation of two other pn-junction diodes corresponding to the potential stabilizer diodes 41 and 42 of FIGS. 5 and 6.

The equivalent electric circuit of this switching device $10_e$ is also like that shown in FIG. 6 for the switching device $10_a$, FIG. 5. Thus the switching device $10_e$ shares the same benefits with the switching devices $10_a$ and $10_b$, FIGS. 5 and 7. The main semiconductor region $12_d$ of this switching device $10_e$ is substitutable for that designated 12 in the embodiments of FIGS. 2 and 5. It is not required or desired that all these pn-junction-forming layers (p-type semiconductor layers) 71-76 be provided altogether; instead, any selected one or more of them may be employed.

Figure 11:
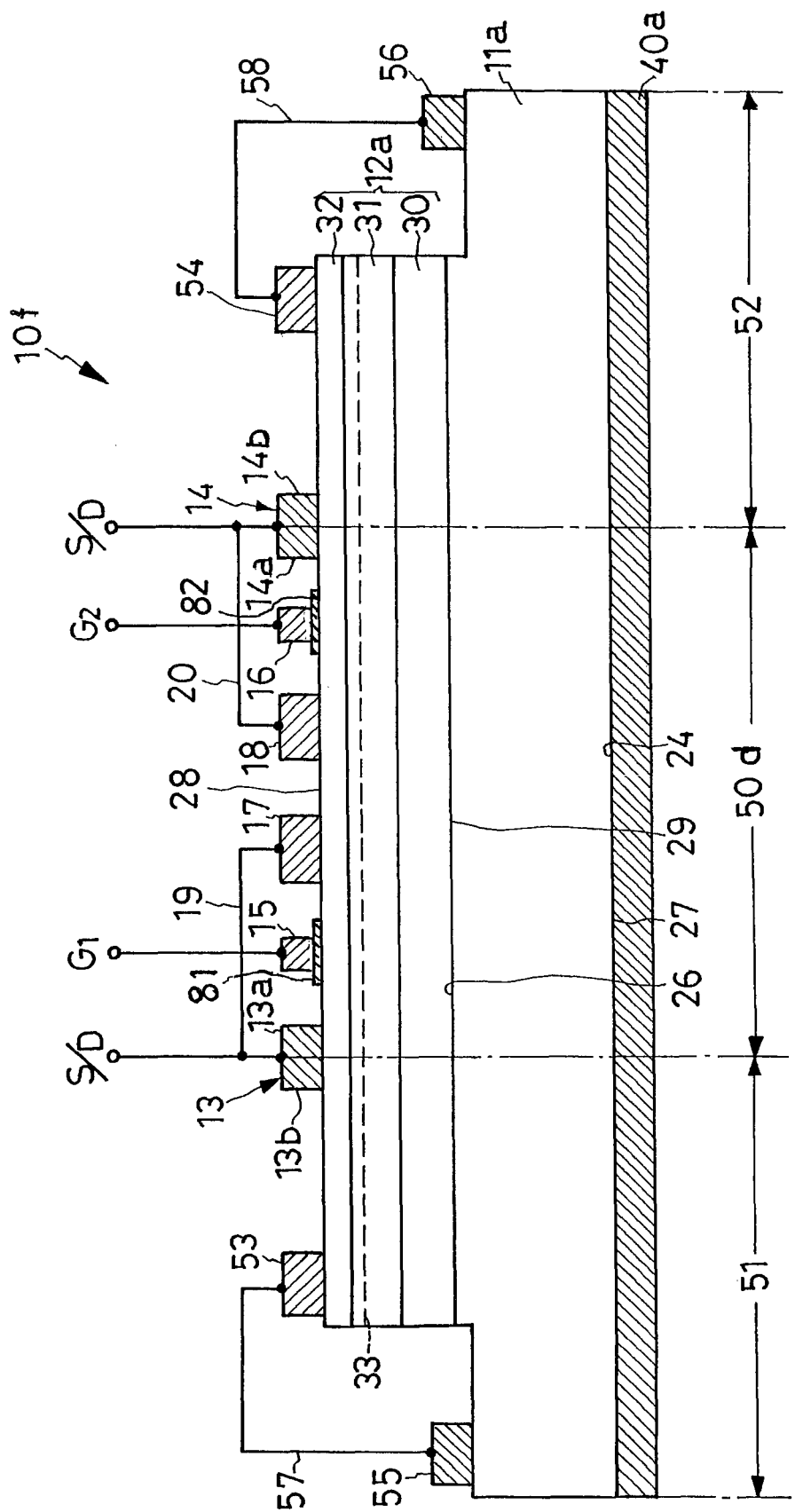
FIG. 11 is a schematic electrical diagram of a further preferred form of switching device according to the invention which is of the same construction as the embodiment of FIG. 7 except for gate insulators under the gate electrodes.

Embodiment of FIG. 11

The main switch section $50_d$ is the sole difference of this switching device $10_f$ from that of FIG. 7. The main switch section $50_d$ of the switching device $10_f$ features gate insulators 81 and 82 interposed between main semiconductor region $12_a$ and gate electrodes 15 and 16 and is otherwise identical with its FIG. 7 counterpart 50.

The main switch section $50_d$ with its newly incorporated gate insulators 81 and 82 operates just like the HEMT $Q_{11}$, FIG. 6, of the switching device $10_a$, so that the switching device $10_f$ possesses the same advantages as do the embodiments of FIGS. 5 and 7. The gate insulators 81 and 82 could be placed under the gate electrodes 15 and 16 in the embodiments of FIGS. 2, 5, 8 and 9 as well.

Figure 12:
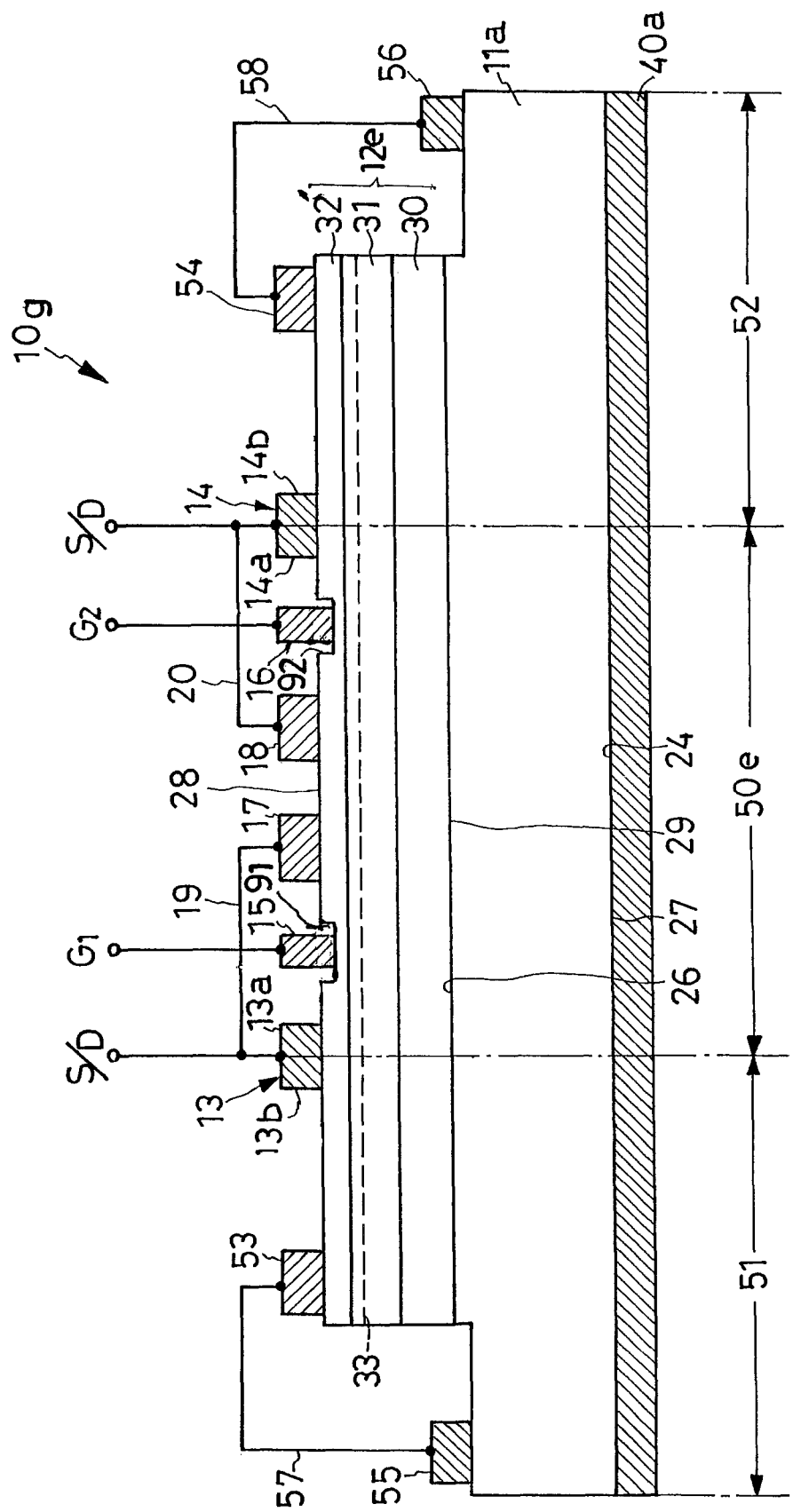
FIG. 12 is a schematic electrical diagram of a further preferred form of switching device according to the invention which also is of the same construction as the embodiment of FIG. 7 except that the main semiconductor region is recessed to receive parts of the gate electrodes.

Embodiment of FIG. 12

Another modified main semiconductor region $12_e$ characterizes this switching device $10_g$, which is otherwise of the same construction as that of FIG. 7. The main semiconductor region $12_e$ differs from its FIG. 7 counterpart $12_a$ only in that the electron supply layer 32' is recessed at 91 and 92 to receive parts of the gate electrodes 15 and 16.

With the electron supply layer 32' thus made thinner under the gate electrodes 15 and 16, the main switch section $50_e$ of this switching device $10_g$ becomes normally off. That is because the 2DEG 33 is pinched off under the gate electrodes 15 and 16, causing nonconduction between the pair of main electrodes 13 and 14, when both first main electrode 13 and first gate electrode 15, as well as both second main electrode 14 and second gate electrode 16, are equal in potential.

The switching device $10_g$ lends itself to use in any of the four different modes described with reference to FIG. 4. The operation of the switching device $10_g$, with its normally-off main switch section $50_e$ will be explained below in those four different modes:

For Switch On Mode, FIG. 4(A), there may be applied to the gate electrodes 15 and 16 voltages that are sufficiently high (e.g., positive) to form the 2DEG under these electrodes. The gate control circuits for application of such gate control voltages are indicated at 24 and 25 in FIG. 6. Conduction will then be established between the pair of main electrodes 13 and 14.

For Switch Off Mode, FIG. 4(B), there may be applied from the gate control circuits 24 and 25 to the gate electrodes 15 and 16 voltages that are sufficiently low (e.g., either zero or negative) to rip open the 2DEG. No current flow will then be possible between the pair of main electrodes 13 and 14.

Negative Current Mode, FIG. 4(C), requires an application of different voltages to the gate electrodes 15 and 16. The voltage applied from first gate control circuit 24 to first gate electrode 15 must be sufficiently high to give rise to 2DEG under that electrode 15. The voltage applied from second gate control circuit 25 to second gate electrode 16, on the other hand, must be sufficiently low not to form 2DEG thereunder. It will then be only the second $D_{12}$ that is electrically connected between the pair of main electrodes 13 and 14.

Operation in Positive Current Mode, FIG. 4(D), is possible by applying to the first gate electrode 15 a voltage sufficiently low to pinch off the 2DEG 33, and to the second gate electrode 16 a voltage sufficiently high to create 2DEG under that second gate electrode. Only the first diode $D_{11}$ will then be electrically connected between the pair of main electrodes 13 and 14.

This switching device $10_g$ with its normally-off main switch section $50_e$ gains the same merits as its FIG. 7 counterpart $10_b$, being of the same construction therewith except for the recesses 91 and 92. These recesses for normally-off operation of the main switch section find use in the embodiments of FIGS. 2, 5, 8, 9 and 11 as well as in those of FIGS. 13 and 15-17 yet to be disclosed.

Figure 13:
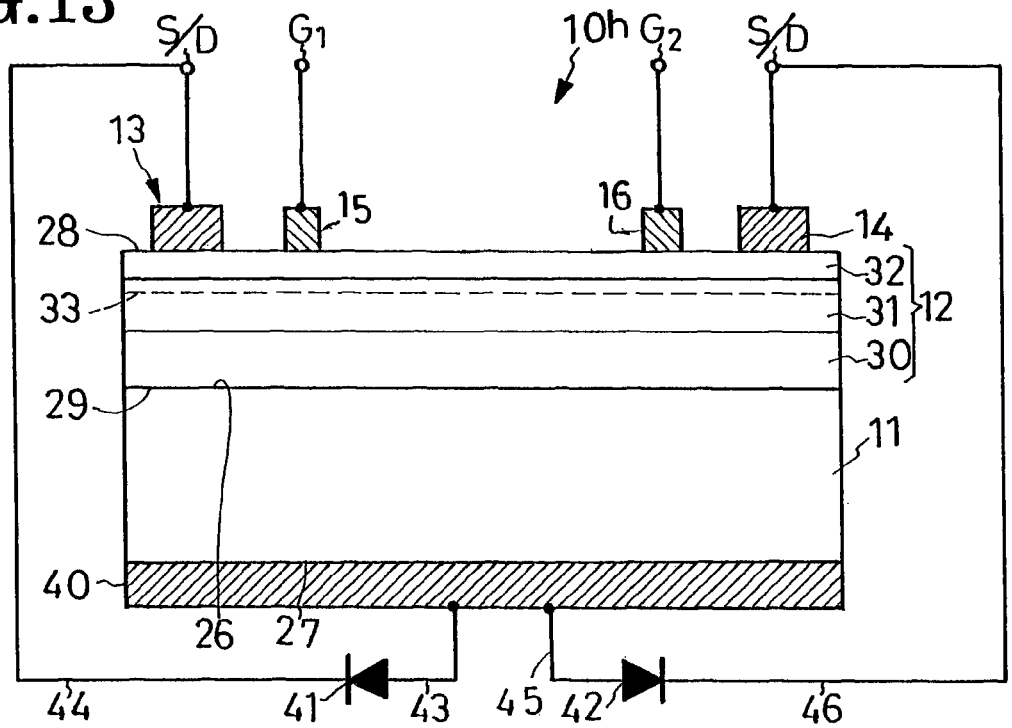
FIG. 13 is a schematic electrical diagram of a further preferred form of switching device according to the invention which is of the same construction as the embodiment of FIG. 5 except for the absence of the two diode-forming electrodes.
Figure 14:
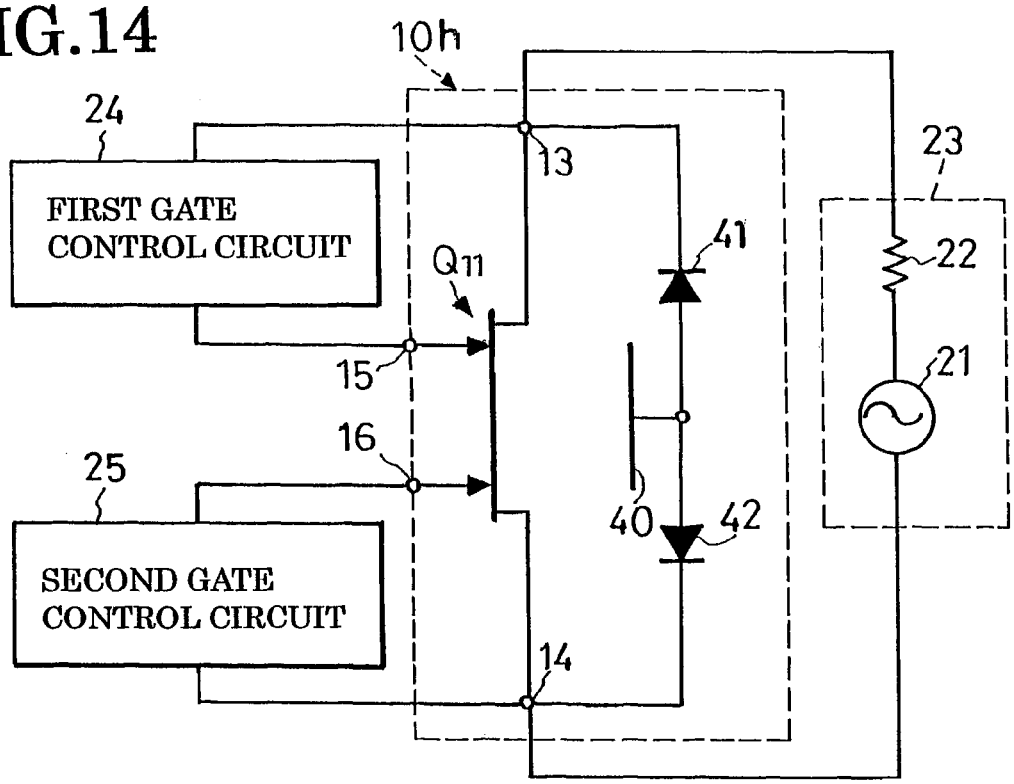
FIG. 14 is an equivalent circuit diagram, partly in block form, of the switching device of FIG. 13 shown together with an electric circuit under the switching control of the device and with gate control circuits for gating control of the device.

Embodiment of FIGS. 13 and 14

The switching device $10_h$ of FIG. 13 is identical with its FIG. 5 counterpart $10_a$ except for the absence of the two diode-forming electrodes 17 and 18. Therefore, as will be noted from FIG. 14, the equivalent circuit of this switching device $10_h$ is identical with that seen at $10_h$ in FIG. 6 minus the diodes $D_{11}$ and $D_{12}$.

The absence of the diode-forming electrodes 17 and 18 from this switching device $10_h$ deprives the same of the benefits accruing from the diodes $D_{11}$ and $D_{12}$. Also, by reason of the lack of these diodes $D_{11}$ and $D_{12}$, the device $10_h$ is incapable of operation in both Negative Current Mode and Positive Current Mode. These shortcomings are counterbalanced, however, by the advantages earned by the two gate electrodes 15 and 16 and by potential stabilization of the substrate 11 by the two potential stabilizer diodes 41 and 42.

Figure 15:
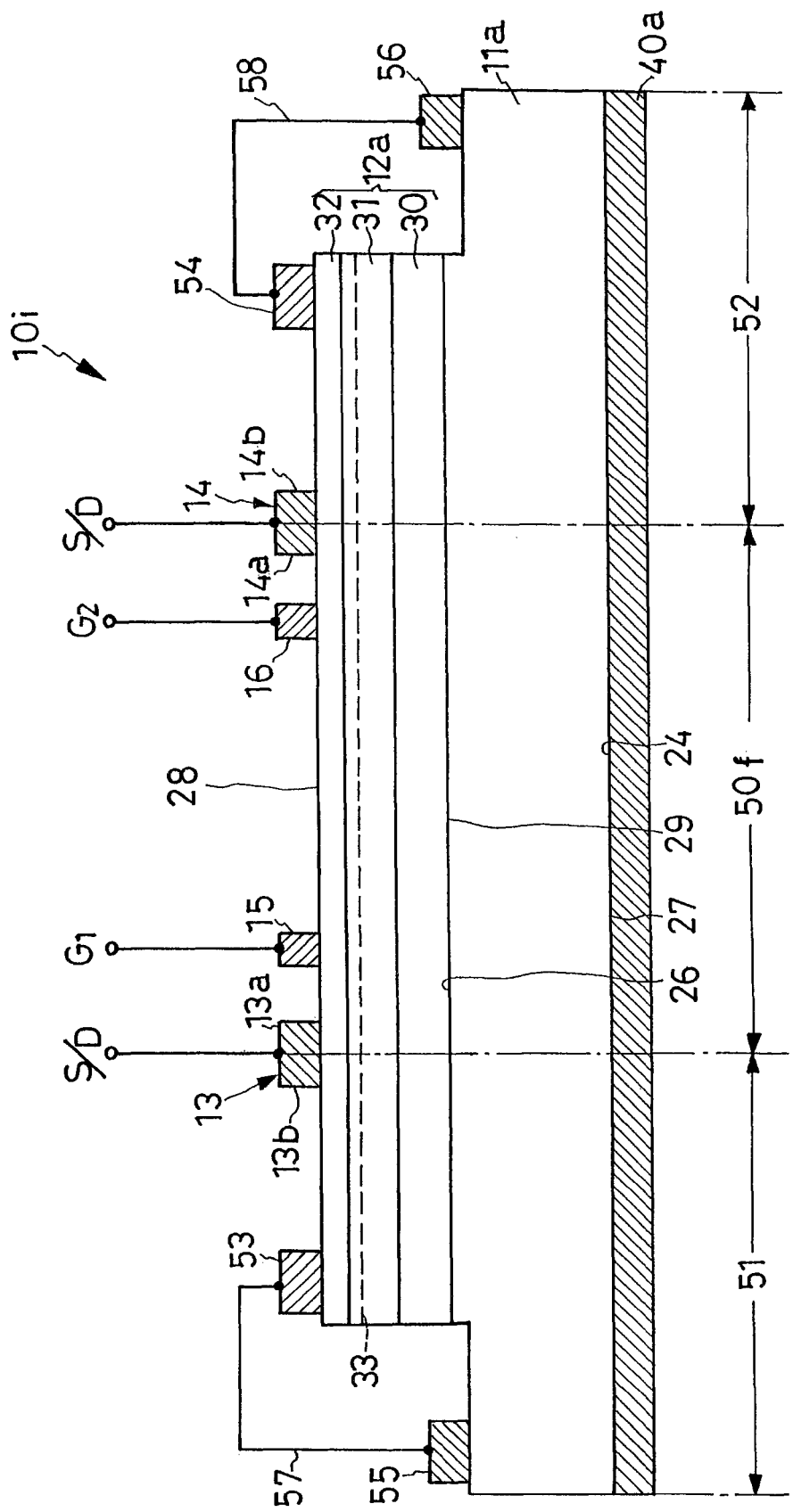
FIG. 15 is a schematic electrical diagram of a further preferred form of switching device according to the invention which is of the same construction as the embodiment of FIG. 7 except for the absence of the two diode-forming electrodes.

Embodiment of FIG. 15

A removal of the two diode-forming electrodes 17 and 18 together with their electrical connections 19 and 20 from the switching device $10_b$, FIG. 7, results in the switching device $10_i$ drawn in FIG. 15. All the other constructional details of the switching device $10_i$ are as previously described with reference to FIG. 7.

This embodiment $10_i$ is also deprived of the benefits associated with the diodes $D_{11}$ and $D_{12}$ and of operation in both Negative and Positive Current Modes by reason of the lack of the diode-forming electrodes 17 and 18. However, just like its FIG. 7 counterpart $10_b$, the switching device $10_i$ possesses the advantages offered by the gate electrodes 15 and 16 as well as the substrate potential stabilization effect thanks to the potential stabilizer diode-forming electrodes 53 and 54. The two diode-forming electrodes 17 and 18 could be omitted from the switching devices $10_c$, $10_d$, $10_e$, $10_f$ and $10_g$ of FIGS. 8-12.

Figure 16:
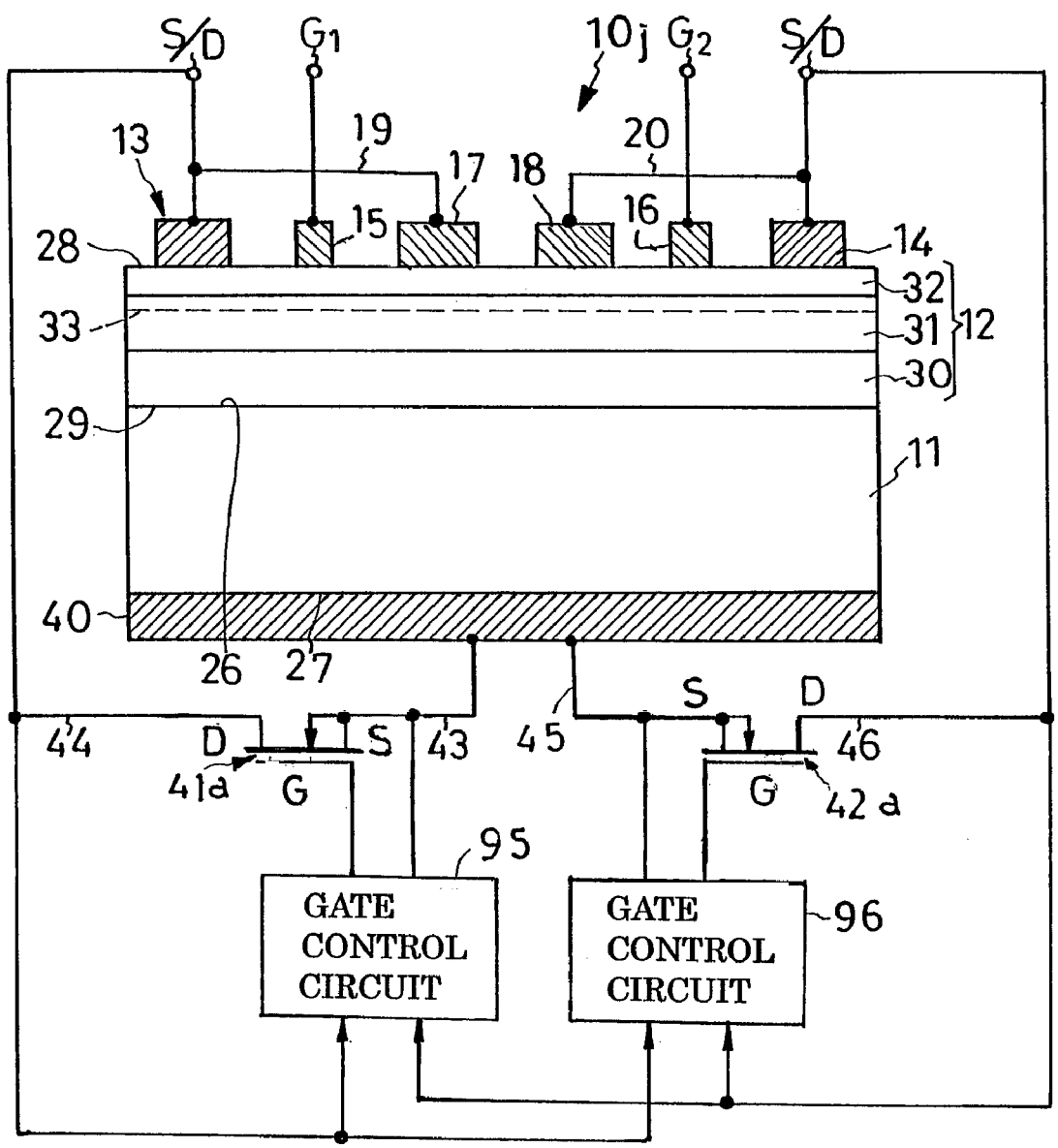
FIG. 16 is a schematic electrical diagram of a further preferred form of switching device according to the invention in which the two potential stabilizer diodes of the embodiment of FIG. 5 are replaced by IGFETs.

Embodiment of FIG. 16

The two potential stabilizer diodes 41 and 42 of the FIG. 5 embodiment are here replaced by controllable semiconductor devices shown as IGFETs $41_a$ and $42_a$ to provide a further preferred switching device $10_j$. The IGFETs $41_a$ and $42_a$ have their sources S connected to the substrate 11 via respective conductors 43 and 45 and the substrate electrode 40, and their drains D connected respectively to the main electrodes 13 and 14 via conductors 44 and 46.

Gate control circuits 95 and 96 are connected respectively between the gate G and source S of the IGFETs $41_a$ and $42_a$. The first gate control circuit 95 is designed to turn on the first IGFET $41_a$ when a negative voltage is impressed between the pair of main electrodes 13 and 14 whereas the second gate control circuit 96 is designed to turn on the second IGFET $42_a$ when a positive voltage is impressed between the pair of main electrodes 13 and 14. Each of the gate control circuits 95 and 96 has inputs connected to the main electrodes 13 and 14 for such on/off control of the IGFETs $41_a$ and $42_a$. The switching device $10_j$ is similar in all the other details of construction to the embodiment of FIG. 5.

It is understood that the IGFETs $41_a$ and $42_a$ are themselves of conventional make such that their source electrode is connected not only to the source region but to the body region as well. There exists, therefore, a parasitic diode between source S and drain D of each such IGFET. These parasitic diodes perform the same functions as do the potential stabilizer diodes 41 and 42, FIG. 5. Each of the IGFETs $41_a$ and $42_a$ may be equivalently depicted as a parallel circuit of FET switch and parasitic diode. The FET switches permit bidirectional current flow therethrough, and the parasitic diodes unidirectional current flow therethrough. This embodiment has all the advantages of that of FIG. 5.

Some modifications of this embodiment are possible. For example, the IGFETs $41_a$ and $42_a$ are replaceable by other controllable semiconductor devices such as npn or pnp junction transistors. These IGFETs or other equivalent devices are substitutable for the potential stabilizer diodes 41 and 42 of the switching device $10_h$, FIG. 13. The diode-forming electrodes 17 and 18 are omissible from the FIG. 16 embodiment. The main semiconductor region 12 of this embodiment is replaceable by any of the main semiconductor regions designated $12_b$, $12_c$, $12_d$ and $12_e$ in FIGS. 8, 9, 10 and 12. The gate insulators 81 and 82, FIG. 11, may be inserted under the gate electrodes 15 and 16 in FIG. 16.

Embodiment of FIG. 17

This switching device $10_k$ is similar in construction to that labeled $10_b$ in FIG. 7 except that the two potential stabilizer diode sections 51 and 52 of the latter are altered into potential stabilizer switch sections 51' and 52' in the former. The potential stabilizer switch sections 51' and 52' of the switching device $10_k$ are configured to provide FETs that function like the IGFETs $41_a$ and $42_a$ of FIG. 16.

The first potential stabilizer switch section 51' of the switching device $10_k$ comprises a third main electrode $53_a$ and third gate electrode 93 for forming the first potential stabilizer FET. Designed to serve as drain of the first potential stabilizer FET, the third main electrode $53_a$ lies opposite the first gate electrode 15 of the main switch section 50 across the first main electrode 13 and makes ohmic contact with the main semiconductor region $12_a$. The third gate electrode 93 lies between first main electrode 13 and third main electrode $53_a$ and makes schottky contact with the main semiconductor region $12_a$ for gating control of the 2DEG 33 between the first and third main electrodes 13 and $53_a$.

A first gate control circuit $95_a$ is electrically connected between first main electrode 13 and third gate electrode 93. The first gate control circuit $95_a$ causes the third gate electrode 93 to cause nonconduction between first main electrode 13 and third main electrode $53_a$ during application of a forward voltage between the pair of main electrodes 13 and 14, and to cause conduction between first main electrode 13 and third main electrode $53_a$ during application of a negative voltage between the pair of main electrodes 13 and 14. Connected to both first and second main electrodes 13 and 14, as is the first gate control circuit 95 of FIG. 16, the first gate control circuit $95_a$ performs the same functions as that circuit 95.

The third main electrode $53_a$ of the first potential stabilizer switch section 51' is connected to the substrate $11_a$ via a bonding pad 55 and conductor 57. The first main electrode 13 is a combination of main electrode part $13_a$ and drain part $13_b$. The main electrode part $13_a$ of the first main electrode 13 belongs to the main switch section 50. The first potential stabilizer FET of the first potential stabilizer switch section 51' is comprised of part of the main semiconductor region $12_a$, third main electrode $53_a$, third gate electrode 93, and drain part $13_b$ of the first main electrode 13.

The second potential stabilizer switch section 52' of the switching device $10_k$ comprises a fourth main electrode $54_a$ and fourth gate electrode 94 for forming the second potential stabilizer FET. Designed to serve as source of the second potential stabilizer FET, the fourth main electrode $54_a$ lies opposite the second gate electrode 16 of the main switch section 50 across the second main electrode 14 and makes ohmic contact with the main semiconductor region $12_a$. The fourth gate electrode 94 lies between second main electrode 14 and fourth main electrode $54_a$ and makes schottky contact with the main semiconductor region $12_a$ for gating control of the 2DEG 33 between the second and fourth main electrodes 14 and $54_a$.

A second gate control circuit $96_a$ is electrically connected between second main electrode 14 and fourth gate electrode 94. The second gate control circuit $96_a$ causes the fourth gate electrode 94 to cause conduction between third main electrode 14 and fourth main electrode $54_a$ during application of a forward voltage between the pair of main electrodes 13 and 14, and to cause nonconduction between third main electrode 14 and fourth main electrode $54_a$ during application of a negative voltage between the pair of main electrodes 13 and 14. Connected to both first and second main electrode 13 and 14, as is the second gate control circuit 96 of FIG. 16, the second gate control circuit $96_a$ performs the same functions as that circuit 96.

The fourth main electrode $54_a$ of the second potential stabilizer switch section 52 is connected to the substrate $11_a$ via a bonding pad 56 and conductor 58. The second main electrode 14 is a combination of main electrode part $14_a$ and drain part $14_b$. The main electrode part $14_a$ of the second main electrode 14 belongs to the main switch section 50. The second potential stabilizer FET of the second potential stabilizer switch section 52' is comprised of part of the main semiconductor region $12_a$, fourth main electrode $54_a$, fourth gate electrode 94, and drain part $14_b$ of the second main electrode 14.

The two FETs formed respectively in the two potential stabilizer switch sections 51' and 52' of this switching device $10_k$ perform functions like those of the potential stabilizer diodes formed in the potential stabilizer diode sections 51 and 52 of the switching device $10_b$, FIG. 7. Thus the switching device $10_k$ possesses the same merits as those of its FIG. 7 counterpart $10_b$.

A variety of modifications will also suggest themselves to the specialists in connection with this embodiment. For example, the FETs exemplified by the potential stabilizer switch sections 51' and 52' of the switching device $10_k$ are replaceable by other controllable semiconductor devices such as npn or pnp junction transistors. The drain parts $13_b$ and $14_b$ and main electrode parts $13_a$ and $14_a$ of the two main electrodes 13 and 14 may be formed as discrete parts and electrically interconnected via either conductors or 2DEG 33. The main semiconductor region $12_a$ of the switching device $10_k$ is replaceable by any of the foregoing main semiconductor regions $12_b$, $12_c$, $12_d$ and $12_e$ of FIGS. 8, 9, 10 and 12. Gate insulators similar to those seen at 81 and 82 in FIG. 11 may be inserted under the gate electrodes 15, 16, 93 and 94 of the switching device $10_k$. The two diode-forming electrodes 17 and 18 are eliminable from the switching device $10_k$.

Possible Modifications

Despite the foregoing detailed disclosure it is not desired that the present invention be limited by the exact showing of the drawings or the description thereof. The following is a brief list of possible modifications, alterations or adaptations of the illustrated embodiments which are all believed to fall within the purview of this invention:

1. The main semiconductor regions 12 and $12_a$-$12_e$ of the various embodiments disclosed herein could be made from semiconducting nitrides such as GaN, AlGaN, InGaN, AlInGaN, AlN, and InAlN, as well as derivatives thereof, from Groups III-V compounds such as AlP, GaP, AlInP, GaInP, AlGaP, AlGaAs, GaAs, AlAs, InAs, InP, InN, and GaAsP, from Groups II-VI compounds such as ZnO, or from other semiconducting compounds.
2. The second semiconductor layers 32 and 32' of the main semiconductor regions 12 and $12_a$, $12_b$ and $12_e$ of HEMT configuration may be replaced by a hole supply layer of a p-type semiconductor. In that case a two-dimensional hole gas will be generated in place of the 2DEG 33. The term comprehending both electron gas and hole gas is "carrier gas."
3. The n-type conductivity of the second semiconductor layer $32_a$, FIG. 9, of the main semiconductor region $12_c$ of the switching device $10_d$ is modifiable into p-type conductivity.
4. In the switching device $10_e$, FIG. 10, the n-type conductivity of the second semiconductor layer $32_a$ of the main semiconductor region $12_d$ is alterable into p-type conductivity, and the p-type conductivity of the pn-junction-forming layers 71-76 into n-type conductivity.
5. The main semiconductor regions 12 and 12-$12_e$ could have recesses formed in their surface to receive parts of the main electrodes 13 and 14, or of either or both of the diode-forming electrodes 17 and 18 and the potential stabilizer diode-forming electrodes 53 and 54.
6. The main semiconductor region $12_e$, FIG. 12, of the switching device $10_g$ could be rendered normally off by any known or suitable means other than the recesses 91 and 92.
7. In all the embodiments of the invention disclosed herein but that of FIG. 10, pn-junction diodes could be employed in lieu of the diodes comprising the diode-forming electrodes 17 and 18 and potential stabilizer diode-forming electrodes 53 and 54.

8. In the switching devices $10_a$ and $10_h$, FIGS. 5 and 13, the potential stabilizer diodes 41 and 42 are replaceable by other devices capable of performing like functions. For example, there may be employed pn junctions between the base and collector of npn transistors, with their base and source short-circuited.

What is claimed is:

1. A solid-state switching device for on-off control of electric circuits, the switching device comprising:
    (a) a main semiconductor region for providing a current-carrying channel therein, the main semiconductor region having a first and a second opposite major surface;
    (b) a first and a second main electrode disposed in spaced-apart positions on the first major surface of the main semiconductor region in ohmic contact therewith;
    (c) first and second gate means disposed in spaced-apart positions between the first and the second main electrode on the first major surface of the main semiconductor region for individually controlling current flow between the first and the second main electrode through the current-carrying channel in the main semiconductor region;
    (d) a first and a second diode-forming electrode disposed between the first and the second gate means on the first major surface of the main semiconductor region;
    (e) a first conductor electrically connecting the first diode-forming electrode to the first main electrode;
    (f) a second conductor electrically connecting the second diode-forming electrode to the second main electrode;
    (g) a first gate control circuit connected between the first main electrode and the first gate means; and
    (h) a second gate control circuit connected between the second main electrode and the second gate means.

2. A solid-state switching device as set forth in claim 1, further comprising:
    (a) a substrate of electroconductive material held against the second major surface of the main semiconductor region;
    (b) a first potential stabilizer switch connected between the substrate and the first main electrode, the first potential stabilizer switch becoming nonconductive in response to a first voltage applied between the first and the second main electrode, and conductive in response to a second voltage applied between the first and the second main electrode, the first voltage being such that the first main electrode is higher in potential than the second main electrode, the second voltage being such that the first main electrode is less in potential than the second main electrode; and
    (c) a second potential stabilizer switch connected between the substrate and the second main electrode, the second potential stabilizer switch becoming conductive in response to the first voltage applied between the first and the second main electrode, and nonconductive in response to the second voltage applied between the first and the second main electrode.

3. A solid-state switching device as set forth in claim 2, wherein the first and the second potential stabilizer switch are both controllable semiconductor devices, and wherein the solid-state switching device further comprises:
    (a) first control means connected to the first potential stabilizer switch for causing conduction therethrough in response to the application of the first voltage between the first and the second main electrode; and
    (b) second control means connected to the second potential stabilizer switch for causing conduction therethrough in response to the application of the second voltage between the first and the second main electrode.

4. A solid-state switching device as set forth in claim 1, further comprising:
    (a) a substrate of electroconductive material held against the second major surface of the main semiconductor region;
    (b) a first potential stabilizer diode-forming electrode disposed opposite the first gate means across the first main electrode on the first major surface of the main semiconductor region for forming a first potential stabilizer diode;
    (c) a second potential stabilizer diode-forming electrode disposed opposite the second gate means across the second main electrode on the first major surface of the main semiconductor region for forming a second potential stabilizer diode;
    (d) a third conductor electrically connecting the first potential stabilizer diode-forming electrode to the substrate;
    (e) a fourth conductor electrically connecting the second potential stabilizer diode-forming electrode to the substrate;
    (f) the first potential stabilizer diode becoming nonconductive in response to a first voltage applied between the first and the second main electrode, and conductive in response to a second voltage applied between the first and the second main electrode, the first voltage being such that the first main electrode is higher in potential than the second main electrode, the second voltage being such that the first main electrode is less in potential than the second main electrode; and
    (g) the second potential stabilizer diode becoming conductive in response to the first voltage applied between the first and the second main electrode and nonconductive in response to the second voltage applied between the first and the second main electrode.

5. A solid-state switching device as set forth in claim 1, further comprising:
    (a) a substrate of electroconductive material held against the second major surface of the main semiconductor region;
    (b) a third main electrode disposed opposite the first gate means across the first main electrode on the first major surface of the main semiconductor region for forming a first potential stabilizer switch;
    (c) third gate means disposed between the first and the third main electrode on the first major surface of the main semiconductor region for controlling current flow between the first and the third main electrode through the current-carrying channel in the main semiconductor region;
    (d) a fourth main electrode disposed opposite the second gate means across the second main electrode on the first major surface of the main semiconductor region for forming a second potential stabilizer switch;
    (e) fourth gate means disposed between the second and the fourth main electrode on the first major surface of the main semiconductor region for controlling current between the second and the fourth main electrode through the current-carrying channel in the main semiconductor region;
    (f) a third conductor electrically connecting the third main electrode to the substrate;
    (g) a fourth conductor electrically connecting the fourth main electrode to the substrate;
    (h) first gate control means connected to the third gate means for causing nonconduction between the first and the third main electrode in response to the application of a first voltage between the first and the second main electrode, and conduction between the first and the third main electrode in response to the application of a second voltage between the first and the second main electrode, the first voltage being such that the first main electrode is higher in potential than the second main electrode, the second voltage being such that the first main electrode is less in potential than the second main electrode; and (i) second gate control means connected to the fourth gate means for causing conduction between the second and the fourth main electrode in response to the application of the first voltage between the first and the second main electrode, and nonconduction between the second and the fourth main electrode in response to the application of the second voltage between the first and the second main electrode.

6. A solid-state switching device as set forth in claim 1, wherein the main semiconductor region comprises two layers of different compositions such that two-dimensional carrier gas is generated as the current-carrying channel.

7. A solid-state switching device as set forth in claim 1, wherein the main semiconductor region has a layer of a prescribed conductivity type as the current-carrying channel.

8. A solid-state switching device as set forth in claim 1, wherein each of the first and the second gate means comprises an electrode in schottky contact with the main semiconductor region, and wherein the first and the second diode-forming electrode are in schottky contact with the main semiconductor region.

9. A solid-state switching device as set forth in claim 1, wherein each of the first and the second gate means comprises:

(a) a gate insulator on the first major surface of the semiconductor region; and (b) a gate electrode on the gate insulator.

10. A solid-state switching device as set forth in claim 1, wherein the main semiconductor region comprises a semiconductor layer of a first conductivity type itself capable of providing the current-carrying channel, and a first and a second pn-junction-forming layer formed on the semiconductor layer, the pn-junction-forming layers being made from a semiconductor of a second conductivity type, and wherein the first and the second gate means comprise a first and a second gate electrode disposed respectively on the first and the second pn-junction-forming layer in ohmic contact therewith.

\* \* \* \* \*